US012660238B2

(12) United States Patent
Padmanabhan et al.

(10) Patent No.: US 12,660,238 B2
(45) Date of Patent: Jun. 16, 2026

(54) BREAKDOWN VOLTAGE IMPROVEMENT IN VERTICAL TRENCH-GATE DEVICES

(71) Applicant: SEMICONDUCTOR COMPONENTS INDUSTRIES, LLC, Phoenix, AZ (US)

(72) Inventors: Balaji Padmanabhan, Chandler, AZ (US); Prasad Venkatraman, Gilbert, AZ (US); Sauvik Chowdhury, San Jose, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 913 days.

(21) Appl. No.: 17/938,096

(22) Filed: Oct. 5, 2022

(65) Prior Publication Data

US 2023/0113308 A1      Apr. 13, 2023

Related U.S. Application Data

(60) Provisional application No. 63/262,324, filed on Oct. 8, 2021.

(51) Int. Cl.
| | |
|---|---|
| *H10D 30/66* | (2025.01) |
| *H10D 30/01* | (2025.01) |
| *H10D 62/10* | (2025.01) |
| *H10D 64/27* | (2025.01) |
| *H10P 30/20* | (2026.01) |

(52) U.S. Cl.
CPC ....... *H10D 30/668* (2025.01); *H10D 30/0297* (2025.01); *H10D 62/127* (2025.01); *H10D 64/513* (2025.01); *H10D 64/519* (2025.01); *H10P 30/222* (2026.01)

(58) Field of Classification Search
CPC ............. H10D 30/668; H10D 30/0297; H10D 62/127; H10D 64/519; H10D 64/513; H01L 21/26586
USPC .......................................................... 257/330
See application file for complete search history.

(56) References Cited

U.S. PATENT DOCUMENTS

| | | |
|---|---|---|
| 2009/0090967 A1 | 4/2009 | Chen et al. |
| 2011/0039383 A1 | 2/2011 | Chen et al. |
| 2011/0220990 A1 | 9/2011 | Chang et al. |
| 2012/0098059 A1 | 4/2012 | Tai et al. |
| 2013/0181283 A1* | 7/2013 | Sato .................... H10D 30/668 257/330 |
| 2014/0048869 A1 | 2/2014 | Yedinak et al. |

(Continued)

*Primary Examiner* — Igwe U Anya
(74) *Attorney, Agent, or Firm* — Brake Hughes Bellermann LLP

(57) ABSTRACT

In a general aspect, a vertical transistor can include a semiconductor region of a first conductivity type, and a plurality of perpendicularly intersecting trenches having a shielded gate structure of the vertical transistor disposed therein. A mesa of the semiconductor region can be defined by the plurality of perpendicularly intersecting trenches. The mesa can include a proximal end portion having a first doping concentration of the first conductivity type, a distal end portion having the first doping concentration of the first conductivity type, and a central portion disposed between the proximal end portion and the distal end portion. The central portion can have a second doping concentration of the first conductivity type that is less than the first doping concentration.

25 Claims, 14 Drawing Sheets

(56) References Cited

U.S. PATENT DOCUMENTS

2016/0260798 A1 * 9/2016 Rupp ................... H10D 12/038
2018/0325812 A1 * 11/2018 Thakur ................. A61K 47/32
2020/0083366 A1 3/2020 Venkatraman et al.
2022/0130996 A1 * 4/2022 Islam .................. H10D 62/154

* cited by examiner

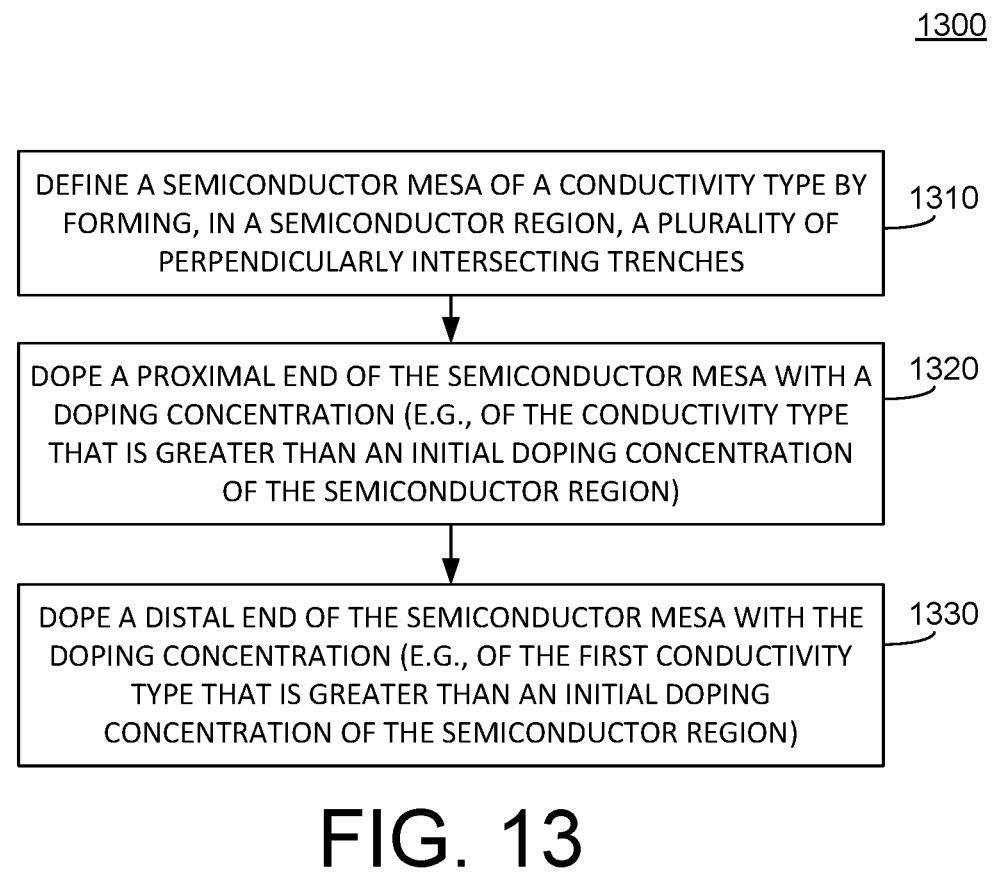

1300

DEFINE A SEMICONDUCTOR MESA OF A CONDUCTIVITY TYPE BY FORMING, IN A SEMICONDUCTOR REGION, A PLURALITY OF PERPENDICULARLY INTERSECTING TRENCHES    1310

DOPE A PROXIMAL END OF THE SEMICONDUCTOR MESA WITH A DOPING CONCENTRATION (E.G., OF THE CONDUCTIVITY TYPE THAT IS GREATER THAN AN INITIAL DOPING CONCENTRATION OF THE SEMICONDUCTOR REGION)    1320

DOPE A DISTAL END OF THE SEMICONDUCTOR MESA WITH THE DOPING CONCENTRATION (E.G., OF THE FIRST CONDUCTIVITY TYPE THAT IS GREATER THAN AN INITIAL DOPING CONCENTRATION OF THE SEMICONDUCTOR REGION)    1330

FIG. 13

BREAKDOWN VOLTAGE IMPROVEMENT IN VERTICAL TRENCH-GATE DEVICES

CROSS-REFERENCE TO RELATED APPLICATIONS

This application is a non-provisional of, and claims priority to, U.S. Provisional Application No. 63/262,324, entitled "TRENCH POWER MOSFET TERMINATION DESIGN AND PROCESS", filed Oct. 8, 2021, which is hereby incorporated by reference in its entirety.

TECHNICAL FIELD

This description relates to power transistors. More specifically, this disclosure relates to shielded trench-gate transistors, such as vertical transistors, with improved voltage breakdown performance.

BACKGROUND

Power transistors (e.g., operating in a range of 10 to 40 volts (V), or higher), such as power metal-oxide-semiconductor field-effect transistors (MOSFETs) with shielded trench-gates, and/or power insulated-gate bipolar transistors (IGBTs) with shielded trench-gates, are used in a number of applications. For instance, these applications can include automotive applications, use in power converters, industrial applications, consumer electronic applications, and so forth. In such devices, use of a shield electrode (e.g., in a lower portion of a trench, such as between a gate electrode and a backside drain or collector terminal) can reduce and/or prevent unwanted electrical coupling (e.g., capacitive coupling) between a drain terminal (of a FET) or a collector terminal (of an IGBT) and a gate terminal of an associated transistor.

In such applications, electrical resistance of the shield electrode can affect performance of the associated transistor, such as gate bounce, avalanche performance capability, unclamped inductive switching performance, and/or application efficiency (e.g., power consumption efficiency of an associated power converter including such transistors). As semiconductor technologies advance, associated device dimensions continue to shrink, which can (e.g., in such shielded gate devices) increase shield resistance, and that increased shield resistance can adversely affect device performance, such as adversely affect the operational properties noted above. In order to reduce shield resistance (e.g., shield electrode resistance), electrical contacts (e.g., from source or emitter signal metal) to a shield electrode can be made (e.g., added) to achieve a desired shield resistance.

However, adding such additional shield contacts can involve interrupting a corresponding gate electrode (e.g., dividing the gate electrode into a plurality of gate electrode segments) to accommodate such shield contacts. Such interruptions in the gate electrode can result in an increased number of metal gate runners being included in the device, e.g., in order to avoid floating gate segments, which can adversely affect the performance of an associated transistor. The increased number of gate runners can take up more area on the die, thus increasing the die size. The increased number of gate runners can also make it more complicated to package the device, since such gate runners interrupt the source (or emitter) metal, and make it more difficult to make a low resistance package interconnect (e.g., wire bond, or clip) to an associated source (emitter, etc.) terminal.

In some implementations, intersecting trenches can be used to allow for placing multiple shield contacts between gate runners. For instance, these intersecting trenches can be implemented in a perpendicular arrangements, and can include trenches with uninterrupted shielded gate electrodes that interconnect the shielded gate electrodes of one active region (active area) of a trench-gate transistor with the shielded gate electrodes of another active region of the transistor. In some implementations, however, implementing such intersecting trenches can reduce a breakdown voltage (e.g., an off-state, avalanche breakdown voltage) of an associated trench-gate transistor.

SUMMARY

In some aspects, the techniques described herein relate to a vertical transistor including: a semiconductor region of a first conductivity type; a plurality of perpendicularly intersecting trenches having a shielded gate structure of the vertical transistor disposed therein; a mesa of the semiconductor region defined by the plurality of perpendicularly intersecting trenches, the mesa including: a proximal end portion having a first doping concentration of the first conductivity type; a distal end portion having the first doping concentration of the first conductivity type; and a central portion disposed between the proximal end portion and the distal end portion, the central portion having a second doping concentration of the first conductivity type that is less than the first doping concentration.

In some aspects, the techniques described herein relate to a vertical transistor, further including: a body region of the vertical transistor disposed in an upper portion of the mesa, the body region being of a second conductivity type opposite the first conductivity type; and a source region of the vertical transistor disposed in the body region.

In some aspects, the techniques described herein relate to a vertical transistor, wherein: the mesa is aligned along a longitudinal axis; the proximal end portion has a first length along the longitudinal axis; the distal end portion has the first length along the longitudinal axis; and the central portion has a second length along the longitudinal axis that is greater than the first length.

In some aspects, the techniques described herein relate to a vertical transistor, wherein: the first length is less than 0.5 micrometers ($\mu$m); and the second length is greater than 3 $\mu$m.

In some aspects, the techniques described herein relate to a vertical transistor, wherein the first doping concentration is in a range of twenty percent to one-hundred fifty percent greater than the second doping concentration.

In some aspects, the techniques described herein relate to a vertical transistor, wherein the mesa is an active mesa of the vertical transistor.

In some aspects, the techniques described herein relate to a vertical transistor, wherein: the mesa is an inactive mesa of the vertical transistor; a first trench of the plurality of perpendicularly intersecting trenches parallel to, and adjacent to a first side of the inactive mesa includes a contact to a shield electrode of the shielded gate structure; and a second trench of the plurality of perpendicularly intersecting trenches parallel to, and adjacent to a second side of the inactive mesa includes a gate pass-through of the shielded gate structure, the second side being opposite the first side.

In some aspects, the techniques described herein relate to a vertical transistor including: a semiconductor region; a first trench disposed in the semiconductor region, the first trench being aligned along a first longitudinal axis; a second trench disposed in the semiconductor region, the second trench being spaced from the first trench and aligned along a second longitudinal axis that is parallel to the first longitudinal axis; a third trench disposed in the semiconductor region, the third trench being aligned along a third longitudinal axis that is perpendicular to the first longitudinal axis, the third trench intersecting the first trench and the second trench; and a fourth trench disposed in the semiconductor region, the fourth trench being spaced from the third trench and aligned along a fourth longitudinal axis that is parallel to the third longitudinal axis, the fourth trench intersecting the first trench and the second trench, the first trench, the second trench, the third trench and the fourth trench defining a mesa of the semiconductor region, the mesa including: a proximal end portion having a first doping concentration of a first conductivity type; a distal end portion having the first doping concentration of the first conductivity type; and a central portion disposed between the proximal end portion and the distal end portion, the central portion having a second doping concentration of the first conductivity type that is less than the first doping concentration.

In some aspects, the techniques described herein relate to a vertical transistor, wherein the mesa is a first mesa, the vertical transistor further including: a fifth trench disposed in the semiconductor region, the fifth trench being spaced from the fourth trench and aligned along a fifth longitudinal axis parallel that is parallel to the fourth longitudinal axis, the fifth trench intersecting the first trench and the second trench, the first trench, the second trench, the fourth trench and the fifth trench defining a second mesa of the semiconductor region, the second mesa including: a proximal end portion having the first doping concentration of the first conductivity type; a distal end portion having the first doping concentration of the first conductivity type; and a central portion disposed between the proximal end portion of the second mesa and the distal end portion of the second mesa, the central portion of the second mesa having the second doping concentration of the first conductivity type, the second mesa being aligned along a seventh longitudinal axis that is co-linear with a longitudinal axis of the first mesa.

In some aspects, the techniques described herein relate to a vertical transistor, wherein the mesa is a first mesa, the vertical transistor further including: a fifth trench disposed in the semiconductor region, the fifth trench intersecting the fourth trench and being aligned along a fifth longitudinal axis that is perpendicular to the fourth longitudinal axis; a sixth trench disposed in the semiconductor region, the sixth trench intersecting the fourth trench and being aligned along a sixth longitudinal axis that is perpendicular to the fourth longitudinal axis, the sixth trench being spaced from the fifth trench; and a seventh trench disposed in the semiconductor region, the seventh trench being spaced from the fourth trench and aligned along a seventh longitudinal axis parallel to the fourth longitudinal axis, the seventh trench intersecting the fifth trench and the sixth trench, the fourth trench, the fifth trench, the sixth trench and the seventh trench defining a second mesa of the semiconductor region, the second mesa including: a proximal end portion having the first doping concentration of the first conductivity type; a distal end portion having the first doping concentration of the first conductivity type; and a central portion disposed between the proximal end portion of the second mesa and the distal end portion of the second mesa, the central portion of the second mesa having the second doping concentration of the first conductivity type, the second mesa being aligned along a seventh longitudinal axis that is co-linear with the first longitudinal axis of the first trench, or co-linear with the second longitudinal axis of the second trench.

In some aspects, the techniques described herein relate to a vertical transistor, wherein: the first trench and the second trench have a first width; and the third trench and the fourth trench have a second width that is greater than the first width.

In some aspects, the techniques described herein relate to a vertical transistor, wherein: the first trench, the second trench, the third trench, and the fourth trench have a same width.

In some aspects, the techniques described herein relate to a vertical transistor, wherein: the proximal end portion and the distal end portion have a first width; and the central portion has a second width that is greater than the first width.

In some aspects, the techniques described herein relate to a vertical transistor, wherein: the mesa is aligned along a fifth longitudinal axis; the proximal end portion has a first length along the fifth longitudinal axis; the distal end portion has the first length along the fifth longitudinal axis; and the central portion has a second length along the fifth longitudinal axis that is greater than the first length.

In some aspects, the techniques described herein relate to a vertical transistor, wherein: the first length is less than 0.5 micro-meters ($\mu$m); and the second length is greater than 3 $\mu$m.

In some aspects, the techniques described herein relate to a vertical transistor, wherein the first doping concentration is in a range of twenty percent to one-hundred fifty percent greater than the second doping concentration.

In some aspects, the techniques described herein relate to a vertical transistor, further including a region of a second conductivity type opposite the first conductivity type disposed in an upper portion of the mesa.

In some aspects, the techniques described herein relate to a method for producing a vertical transistor, the method including: defining a semiconductor mesa of a conductivity type by forming, in a semiconductor region of the conductivity type, a plurality of perpendicularly intersecting trenches; and performing at least one implant of the conductivity type to: dope a proximal end of the semiconductor mesa with a first doping concentration; and dope a distal end of the semiconductor mesa with the first doping concentration, a central portion of the semiconductor mesa disposed between the proximal end and the distal end having a second doping concentration that is less than the first doping concentration.

In some aspects, the techniques described herein relate to a method, wherein the second doping concentration is an initial doping concentration of the semiconductor region.

In some aspects, the techniques described herein relate to a method, wherein performing the at least one implant includes: forming a mask to exclude the at least one implant from the central portion of the semiconductor mesa; and performing the at least one implant orthogonal to a surface of the semiconductor region.

In some aspects, the techniques described herein relate to a method, wherein the at least one implant is performed: after formation of a shield electrode in the plurality of perpendicularly intersecting trenches; or after formation of the shield electrode and a gate electrode in the plurality of perpendicularly intersecting trenches.

In some aspects, the techniques described herein relate to a method, wherein: the semiconductor mesa is aligned along a longitudinal axis; and performing the at least one implant includes: performing a first implant in a first direction parallel to the longitudinal axis; and performing a second implant in a second direction parallel to the longitudinal axis, the second direction being opposite the first direction, the first implant and the second implant being performed at an angle between twenty degrees and sixty degrees relative to a line that is orthogonal to a surface of the semiconductor region.

In some aspects, the techniques described herein relate to a method, further including: prior to performing the at least one implant, forming a sacrificial material layer in the plurality of perpendicularly intersecting trenches; and after performing the at least one implant, removing the sacrificial material layer.

In some aspects, the techniques described herein relate to a method, wherein forming the plurality of perpendicularly intersecting trenches includes: prior to performing the at least one implant, performing a first trench etch to a first depth in the semiconductor region; and after performing the at least one implant, a second trench etch to a second depth in the semiconductor region, the second depth being greater than the first depth.

In some aspects, the techniques described herein relate to a method, wherein: the semiconductor mesa is aligned along a longitudinal axis; and performing the at least one implant includes: performing a first implant in a first direction that is at an angle of sixty degrees relative to a line that is orthogonal to a surface of the semiconductor region and at an angle that is between ninety and one-hundred and twenty degrees relative to the longitudinal axis; and performing a second implant in a second direction that is at the angle of sixty degrees relative to the line that is orthogonal to the surface of the semiconductor region and at an angle that is between two-hundred and forty degrees and two-hundred and seventy degrees relative to the longitudinal axis.

BRIEF DESCRIPTION OF THE DRAWINGS

FIG. 13 is a flowchart illustrating a method for producing a semiconductor device.

Figure 1A:
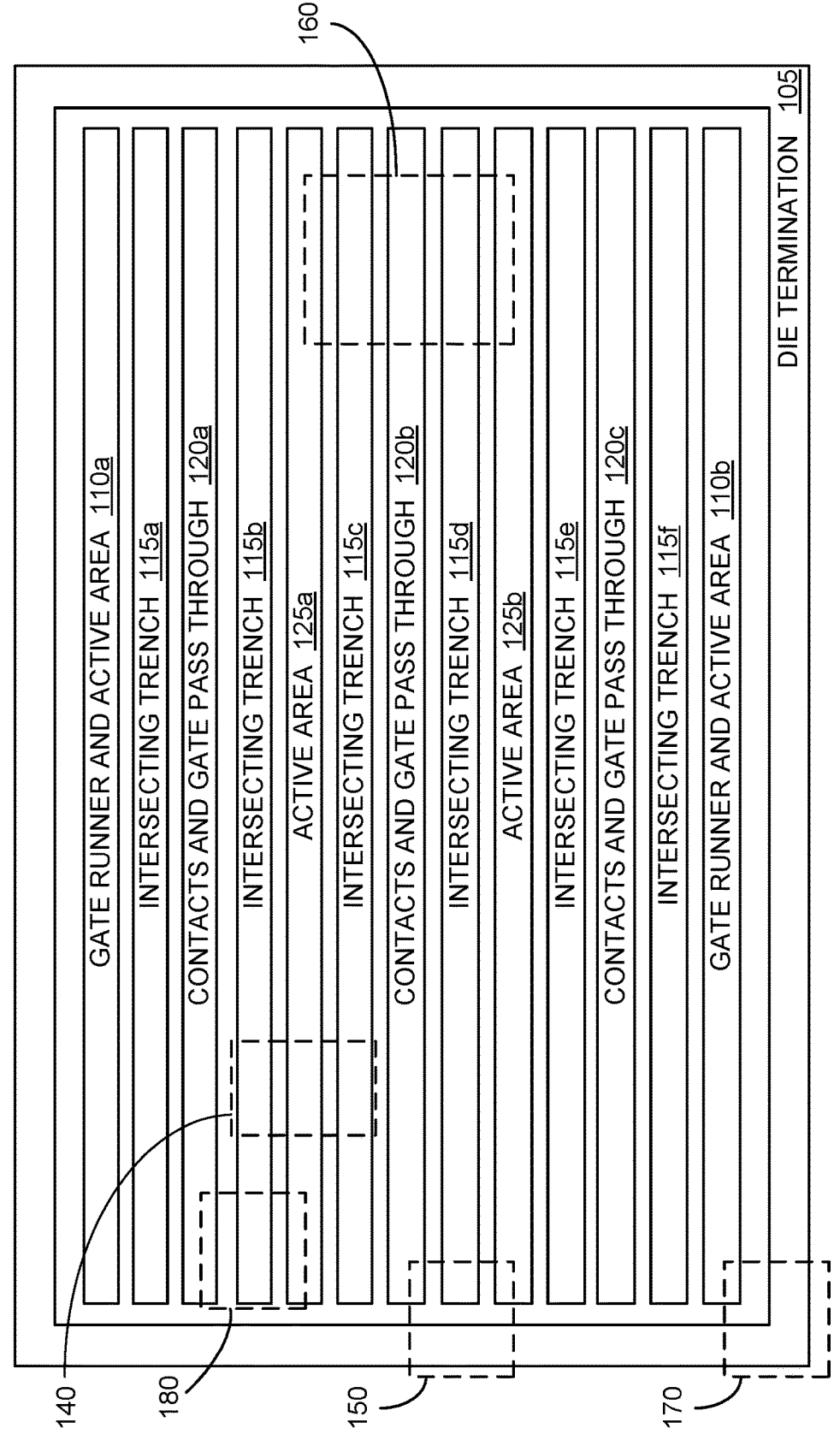
FIG. 1A is a block diagram that schematically illustrates an example vertical transistor.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in the same view, or in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated in a given view.

DETAILED DESCRIPTION

The present disclosure is directed to trench gate transistors that can address at least some of the drawbacks noted above. For purposes of illustration and discussion, the examples illustrated herein are generally described with respect to shielded trench-gate field-effect transistors (FETs). In some implementations, the disclosed approaches can be used in conjunction with other types of transistors, such as insulated-gate bipolar transistor (IGBTs) with shielded gates. For IGBT implementations, the references to a transistor source, or source region, herein would correspond to a transistor emitter, or emitter region, while the references to a transistor drain, or drain region, would correspond to a transistor collector, or collector region. Also, in some implementations, the conductivity types discussed herein can be reversed (e.g., n-type and p-type conductivities can be reversed).

The implementations described herein can be used to implement shielded-gate transistors with both low shield resistance and low gate resistance, while preventing adverse effects on breakdown voltages of associated transistors. That is, the disclosed implementations can improve (e.g., for shielded trench-gate transistors) gate bounce, unclamped inductive switching performance, and/or device efficiency, while reducing adverse impact on associated transistor breakdown voltages. For instance, in example implementations, breakdown at ends of semiconductor mesas can be reduced due to increased depletion at the mesa ends, e.g., as a result of depletion occurring on three sides of the mesa, as compared to depletion on two sides of the mesa in a central portion of the mesa between the corresponding end portions.

In the approaches described, herein ends (e.g., proximal and distal ends) of semiconductor mesas defined by intersecting shielded gate trenches can be implanted to having a different doping concentration than corresponding central portions of the mesas, where a central mesa portion is disposed between respective proximal and distal portions (ends) of a mesa. In some implementations, the end portions can be implanted to have a higher doping concentration than a corresponding central portions. This higher doping concentration can affect charge balance (e.g., increase available charge) proximate the mesa end portions, which can reduce the effects of three-sided depletion. As a result, the disclosed approaches increase breakdown voltage (e.g., breakdown voltage in the end portions of the mesa), as compared to prior approaches with intersecting trenches with uniformly doped mesas. Accordingly, such approaches can allow for achieving both low shield electrode resistance and low gate electrode resistance, without adding additional gate runners or adversely impacting breakdown voltage.

FIG. 1A is a block diagram that schematically illustrates a semiconductor device 100 in which a vertical, shielded trench-gate transistor can be implemented. The arrangement of the semiconductor device 100 is given by way of example and for purposes of illustration. In some implementations, other arrangements of a semiconductor device including a vertical, shielded trench-gate transistor are possible. For instance, in example implementations, the elements (areas or regions) of the semiconductor device 100 could be arranged differently, additional elements could be added, or elements could be removed. The elements included, and their arrangement will depend on the particular implementation.

As shown in FIG. 1A, the semiconductor device 100 includes various areas (or regions). For instance, in this example, the semiconductor device 100 includes die termination 105, gate runner and active area (gate runner area 110a), gate runner and active area (gate runner area 110b), an intersecting trench 115a, an intersecting trench 115b, an intersecting trench 115c, an intersecting trench 115d, an intersecting trench 115d, an intersecting trench 115f, contact and gate pass through area (pass through area 120a), contact and gate pass through area (pass through area 120b), contact and gate pass through area (pass through area 120c), active area (active area 125a), and active area (active area 125b). As noted above, in some implementations, other arrangements are possible, and the arrangement of the semiconductor device 100 shown in FIG. 1A is given by way of example.

Using the approaches described herein, end portions (e.g., proximal and distal end portions) of semiconductor mesas in the gate runner areas 110a-110b, the pass through areas 120a-120c, and the active areas 125a-125b can be implanted to have a higher doping concentration than a doping concentration of respective central portions of the mesas. This higher doping concentration can provide sufficient charge balance to compensate for three-sided depletion that occurs at the end portions, which can reduce adverse impacts to breakdown voltage of the corresponding transistor. That is, the higher doping concentration can result in impact ionization in the end portions being distributed similar to impact ionization in the central portions (e.g., such that breakdown voltage in the end portions is consistent with breakdown voltage in the central portions).

In the semiconductor device 100, the die termination 105 can include a number of different termination structures, such as a trench having a poly-electrode disposed therein that is coupled with a source terminal (e.g., electrical ground), such as source metal, of the corresponding transistor. In some implementations, the die termination 105 can include other structures, such as an oxide filled trench, floating guard rings, and/or biased guard rings, as some examples.

In some implementations, while not explicitly shown in FIG. 1A, the semiconductor device 100 can also include a plurality of trenches that are arranged perpendicular to the intersecting trenches 115a-115f. Such trenches can be arranged along longitudinal axes that are vertically arranged in the view of FIG. 1A, e.g., from the gate runner area 110a to the gate runner area 110b. Various arrangements, of such vertically arranged trenches are described herein. For instance, in some implementations, a vertically extending trench can linearly extend from the gate runner area 110a to the gate runner area 110b. e.g., such as in the examples of at least FIGS. 2A, 2B and 3. In other implementations, the vertically arranged trenches can be staggered, e.g., at intersections with the intersecting trenches 115a-115f, e.g., such as in the example of at least FIGS. 5A and 5C.

In the example of FIG. 1A, the gate runner area 110a and the gate runner area 110b can include active segments of the corresponding transistor of the semiconductor device 100, as well as respective gate runners (gate metal layers) running left to right in the view of FIG. 1A. Contacts from the gate runners to the gate electrode (or electrodes) in the vertically arranged trenches can be made in the gate runner area 110a and the gate runner area 110b. Additionally, a portion of the gate runner area 110a and the gate runner area 110b can include source metal for the transistors, and contacts from the source metal to source and body regions of the transistor can be made in these areas.

The intersecting trenches 115a-115f can include shield electrodes and gate electrodes of the corresponding transistor, where shield electrodes and gate electrodes in the vertically arranged trenches are electrically coupled with the respective electrodes in the intersecting trenches 115a-115f, e.g., at their respective intersections. For instance, the shield electrodes in the intersecting trenches 115a-115f and the vertically arranged trenches can be formed from a first polysilicon layer, while the gate electrodes in the intersecting trenches 115a-115f and the vertically arranged trenches can be formed from a second polysilicon layer.

Figure 3:
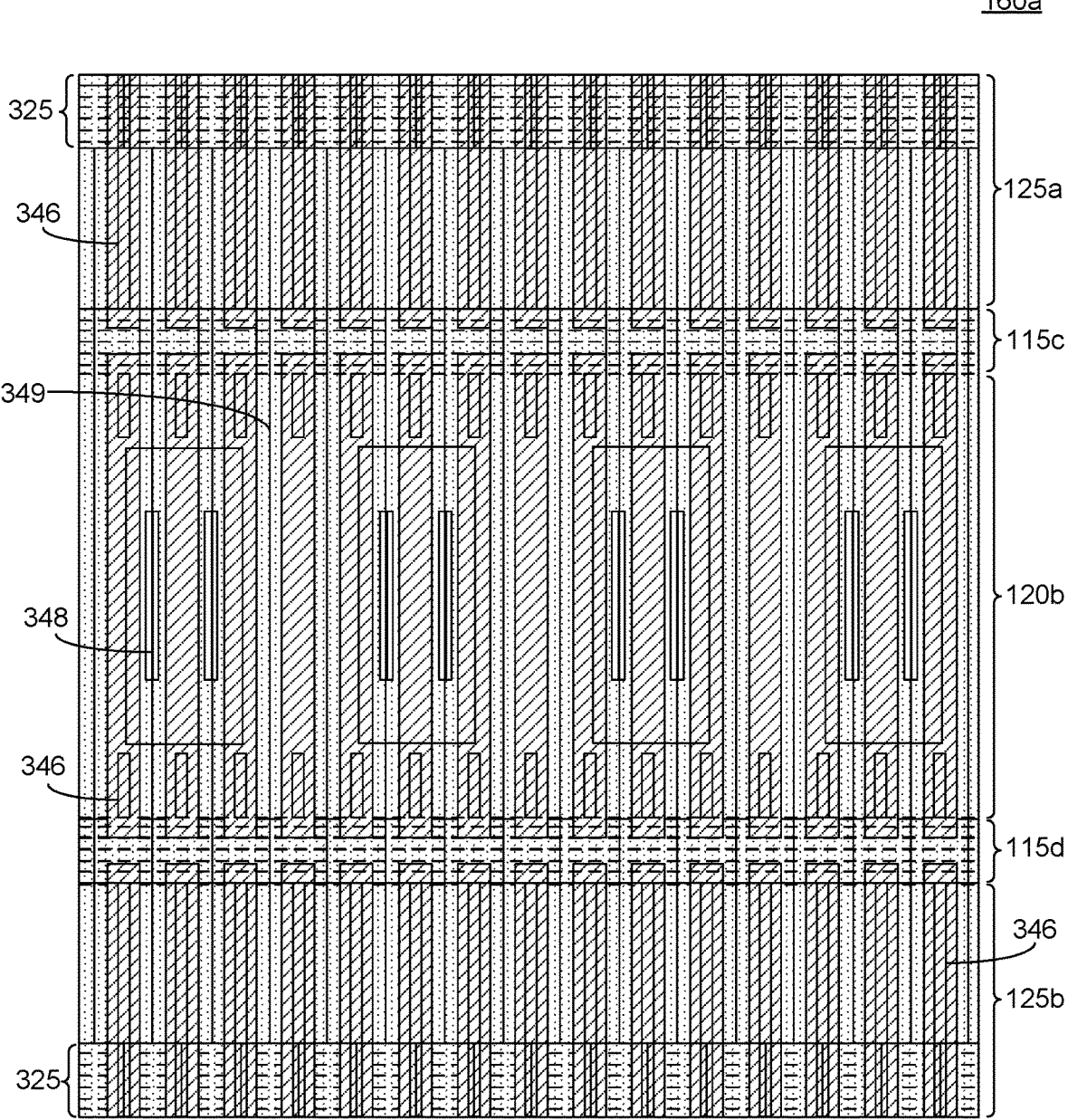
FIG. 3 is a diagram illustrating a portion of a vertical transistor, such as the vertical transistor of FIG. 1A.

The pass through areas 120a-120c can include contacts to the shield electrode in one more vertically arranged trenches. For instance, a photolithography mask can be used to define contact regions for the shield electrode, such that the shield electrode comes to the top of a corresponding vertically arranged trench and are contacted to source metal. The pass through areas 120a-120c can also include gate pass through trenches (e.g., vertically arranged trenches) that exclude shield contacts, such that polysilicon of the gate electrode is uninterrupted in these trenches. That is, in the pass through areas 120a-120c, trenches including shield electrode contacts can be in parallel with gate pass through trenches, such as shown in FIG. 3.

In this example, the active area 125a and the active area 125b can include active segments of the transistor of the semiconductor device 100. Due to the arrangement of the gate electrode in the intersecting trenches 115a-115f and the gate pass through trenches of the pass through areas 120a-120c, a gate runner can be excluded, and uninterrupted source metal can extend from the gate runner area 110a to the gate runner area 110b, e.g., between, and electrically isolated from, the respective gate runners. Contacts from the source metal to source and body regions of the corresponding transistor can also be implemented in the active area 125*a* and the active area 125*b*.

A number of insets are shown in FIG. 1A, indicating respective portions of the semiconductor device 100. For instance, an inset 140 includes portions of the intersecting trench 115*b*, the active area 125*a* and the intersecting trench 115*c*, and corresponds with, at least, the example of FIG. 1B. An inset 150 includes portions of the die termination 105, a portion of the pass through area 120*b*, a portion of the intersecting trench 115*d* and a portion of the active area 125*b*, and corresponds, at least, with the examples of FIGS. 2A, 2B, 5A and 6A. An inset 160 includes portions of the active area 125*a*, the intersecting trench 115*c*, the pass through area 120*b*, the intersecting trench 115*d*, and the active area 125*b*, and corresponds, at least, with the example of FIG. 3. An inset 170 includes portions of the die termination 105, and the gate runner area 110*b*, and corresponds, at least, with the example of FIG. 5B. An inset 180 includes portions of the pass through area 120*a*, the intersecting trench 115*b*, and the active area 125*a*, and corresponds with, at least, the examples of FIGS. 7 and 8.

Figure 1B:
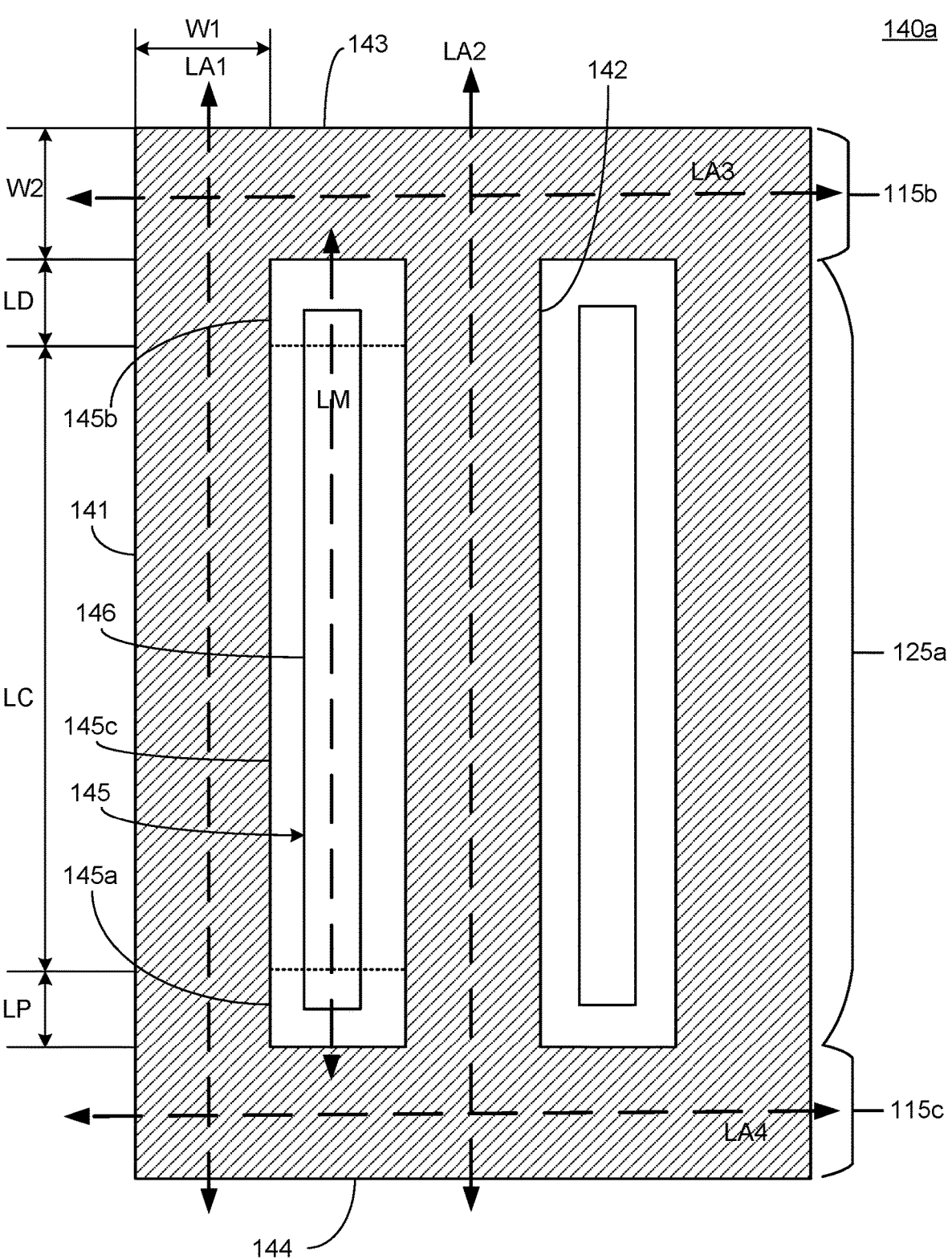
FIG. 1B is a diagram illustrating a portion of a vertical transistor, such as the vertical transistor of FIG. 1A.

FIG. 1B is a diagram illustrating a portion 140*a* of a vertical transistor, such as the vertical transistor of FIG. 1A. The portion 140*a*, as noted above, corresponds with the inset 140 in FIG. 1A, and includes portions of the intersecting trench 115*b*, the active area 125*a* and the intersecting trench 115*c*, each of which are indicated in FIG. 1B.

As shown in FIG. 1B, the portion 140*a* includes a trench 141 and a trench 142, e.g., vertically arranged trenches. The trench 141 is arranged along a longitudinal axis LA1, and the trench 142 is arranged along a longitudinal a longitudinal axis LA2. The portion 140*a* further includes a trench 143 and a trench 144, e.g., intersecting trenches. The trench 143 is arranged along a longitudinal axis LA3, and the trench 144 is arranged along a longitudinal a longitudinal axis LA4, where the longitudinal axis LA3 and the longitudinal axis LA4 are perpendicular to the longitudinal axes LA1 and LA2. The trenches 141-144, which can be referred to as a plurality of intersecting trenches, are shown by way of example, and for purposes illustration. In some implementations, the trenches 141-144 can be extended, in one or more directions, along their respective longitudinal axes. In implementations, the arrangement shown in FIG. 1B can be repeated on the top, bottom, left, and/or right to implement additional vertically arranged and/or intersecting trenches.

As shown in FIG. 1B, the trench 141 (and the trench 142) can have a width W1, while the trench 143 (and the trench 144) can have a width W2. In some implementations, the width W1 and the width W2 can be a same width, while in other implementations, the width W1 can be different than (e.g., less than) the width W2. For instance, the width W1 and the width W2 can be selected based on an approach used (e.g., an angle of implant) used to dope end portions of mesas defined the plurality of intersecting trenches.

As shown by the portion 140*a* in FIG. 1B, the plurality of intersecting trenches define a plurality of semiconductor mesas, which can be defined from a semiconductor region of a first conductivity type, e.g., n-type conductivity. For instance, the trenches 141-143 define a semiconductor mesa 145 that is arranged along a longitudinal axis LM that is parallel to the longitudinal axes LA1 and LA2. A contact 146 can be defined on, and/or in the semiconductor mesa 145 to contact a body region of a second conductivity type (e.g., p-type conductivity) and/or a source region of the first conductivity type of a corresponding transistor.

The semiconductor mesa 145 in FIG. 1B includes a proximal end portion 145*a*, a distal end portion 145*b*, and a central portion 145*c* that is disposed between the proximal end portion 145*a* and the distal end portion 145*b*. Using the approaches described herein, an implant can be performed to increase a doping concentration of the proximal end portion 145*a* and the distal end portion 145*b*, e.g., by twenty percent to one hundred and fifty percent, relative to a doping concentration (e.g., an initial doping concentration) of the central portion 145*c*. That is, in this example, after performing and diffusing such an implant (e.g., with arsenic and/or phosphorous), the n-type doping concentration of the proximal end portion 145*a* and distal end portion 145*b* can be greater than an n-type doping concentration of the central portion 145*c*. As described herein, the higher doping concentration in the proximal end portion 145*a* and the distal end portion 145*b* can increase available charge in the end portions (e.g., modify charge balance) to compensate for three-sided depletion of the end portions of the semiconductor mesa 145. Such modification of charge balance can improve breakdown voltage performance of the corresponding transistor, e.g., by increasing breakdown voltage in the semiconductor mesa 145 at the proximal end portion 145*a* and the distal end portion 145*b*. Other semiconductor mesas of the corresponding transistor can be similarly implanted.

As shown in FIG. 1B, the proximal end portion 145*a* can have a length LP along the longitudinal axis LM, the distal end portion 145*b* can have a length LD along the longitudinal axis LM, and the central portion 145*c* can a length LC along the longitudinal axis LM. In some implementations, the length LP and the length LD can be a same length, or can be a different length. In an example, the length LP and the length LD can be in a range of 0.2 microns (μm) to 0.25 μm, while the length LC can be 3 μm, or greater. In some implementations, the length LP and the length LD can be selected based on a width of the semiconductor mesa 145 in the end portions, e.g., orthogonal to the longitudinal axis LM.

Figure 2A:
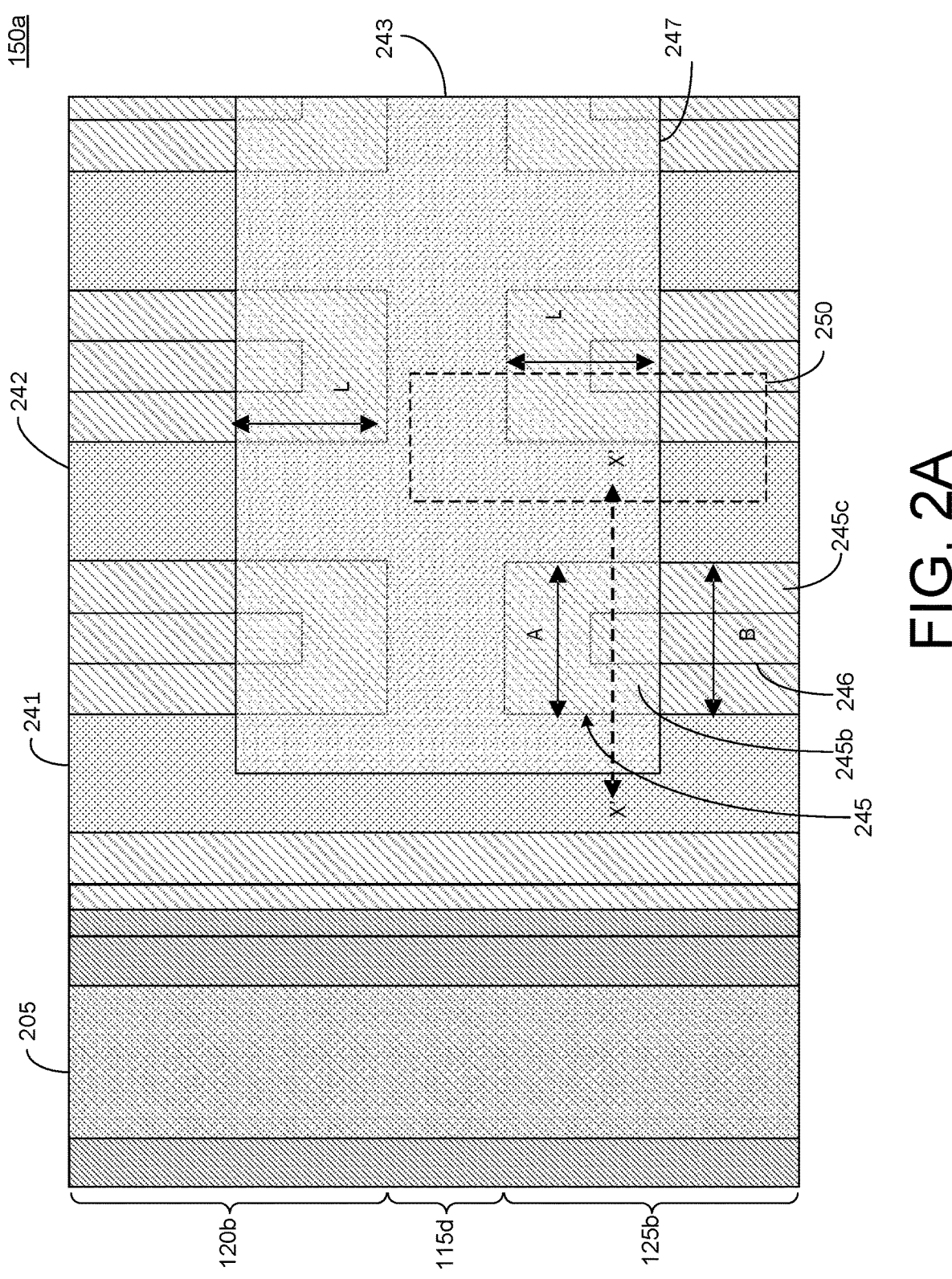
FIG. 2A is a diagram illustrating an example of a portion of a vertical transistor, such as the vertical transistor of FIG. 1A.

FIG. 2A is a diagram illustrating a portion 150*a* of a vertical transistor, such as the vertical transistor of FIG. 1A. The portion 150*a*, as noted above, corresponds with the inset 150 in FIG. 1A, and includes portions of the die termination 105 (referenced as die termination 205), the pass through area 120*b*, the intersecting trench 115*b*, and the active area 125*b*, each of which are indicated in FIG. 2A. The die termination 205, as with the die termination 105, can include one or more termination structures, where the specific termination structures can depend on the particular implementation.

The portion 150*a* in FIG. 2A is illustrated as a design layout based on different masking layers that can be used to form and/or define various features of an associated semiconductor device and corresponding vertical trench-gate transistor. For instance, a trench masking layer can be used to define trenches for the die termination 205 and for a plurality of perpendicularly intersecting trenches, and a contact mask can be used to define contacts to body and/or source regions in semiconductor mesas, such as a contact 246, as well as other contacts of a corresponding semiconductor device.

As shown in FIG. 2A, the plurality of perpendicularly intersecting trenches can include a trench 241 and a trench 242, e.g., vertically arranged trenches. The plurality of perpendicularly intersecting trenches can further include a trench 243, e.g., an intersecting trench. As with the portion 140*a* of FIG. 1B, the plurality of intersecting trenches in the portion 150*a* can define one or more semiconductor mesas, such as the semiconductor mesa 245, from a semiconductor region, e.g., an epitaxial semiconductor region of n-type conductivity.

In the example of FIG. 2A, only portions of semiconductor mesas (including the semiconductor mesa 245) defined by the plurality of intersecting trenches are shown. For instance, a distal end portion 245*b* of the semiconductor mesa 245 is shown, while only part of a central portion 245*c* of the semiconductor mesa 245 is shown. The proximal end portion of the semiconductor mesa 245 is not shown in FIG. 2A.

FIG. 2A further illustrates an implant mask 247 that can be used to define a hard mask to block portions of a corresponding semiconductor device other than the proximal and distal ends the semiconductor mesas and portions of the intersecting trenches adjacent to the end portions. That is, in the example of FIG. 2A, areas of a semiconductor die outside an area of the implant mask 247, which can be used to form an opening in a hard mask material, will not receive the implant used to increase doping concentration of the end portions of the mesas, e.g., the hard mask will block the implant in areas outside the area of the implant mask 247.

In this example, one or more implants can be performed orthogonally to a surface of the semiconductor device (e.g., perpendicular into the page in the view of FIG. 2B) to increase doping concentration of end portions of the semiconductor mesas through an opening in hard mask material corresponding with the implant mask 247. For instance, multiple implants with different energies and/or impurity doses can be performed. In some implementations, the implants to increase the doping concentration of the end portions can be performed after shield electrode formation, or after gate electrode formation. In some implementations, a planarization process can be performed prior to forming the hard mask and performing the one or more implants.

As shown in FIG. 2A, the distal end portion 245*b* of the semiconductor mesa 245 can have a width A, and the central portion 245*c* of the semiconductor mesa 245 can have a width B. In this example, the width A and the width B can be a same width. As also shown in FIG. 2A, a distance from the trench 243 to an edge of the implant mask 247 can be a length L along a respective mesa, e.g., along a longitudinal axis of the mesa. The length L can depend on the width A of the distal end portion 245*b* and the doping concentration of the distal end portion 245*b*, e.g., to achieve a desired amount of charge (charge balance) in the distal end portion 245*b*. FIG. 2A also includes a section line X'-X' that corresponds with the example sectional view shown in FIG. 2C, and an inset 250, which corresponds with the examples of FIGS. 4A and 4B.

Figure 2B:
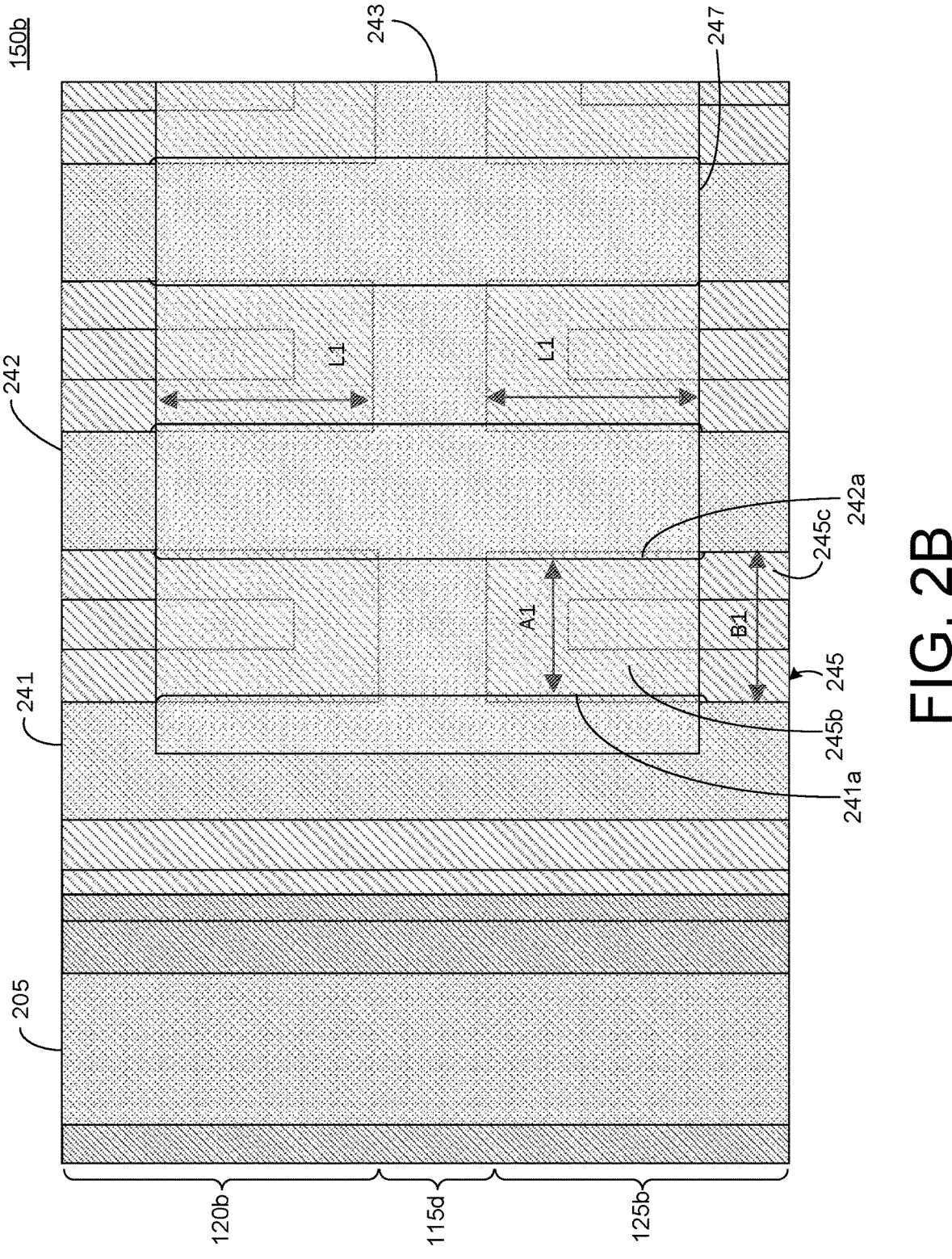
FIG. 2B is a diagram illustrating another example of a portion of a vertical transistor, such as the vertical transistor of FIG. 1A.

FIG. 2B is a diagram illustrating another example of a portion 150*b* of a vertical transistor, such as the vertical transistor of FIG. 1A. The portion 150*b* of FIG. 2B is similar to the portion 150*a* of FIG. 2A, and like reference numbers are used to reference like elements. Accordingly, for purposes of brevity, details of the portion 150*b* corresponding with the portion 150*a* are not described in detail again here.

The portion 150*b* shown in FIG. 2B differs from the portion 150*a* in that the trench 241 includes a wider portion 241*a*, where the wider portion 241*a* corresponds with the distal end portion 245*b*. Likewise, the trench 242 includes a wider portion 242*a*, where the wider portion 242*a* also corresponds with the distal end portion 245*a*. The wider portion 241*a* and the wider portion 242*a* result in the semiconductor mesa 245 being narrow in the distal end portion 245*b* (as well as in a proximal end portion).

Accordingly, as shown in FIG. 2B, the distal end portion 245*b* has a width A1, while the central portion 245*c* has a width B1. As compared to the portion 150*a* of FIG. 2A, the width A1 can be narrower than the width A, while the width B1 can be a same width as the width B. Other trenches and semiconductor mesas of the portion 150*b*, and a vertical transistor of a corresponding semiconductor device, can similarly arranged.

In the example of FIG. 2B, a distance from the trench 243 to an edge of the implant mask 247 can be a length L1 along a respective mesa, which, as compared to FIG. 2A, can be larger than the length L, e.g., to achieve a desired amount of charge in the distal end portion 245*b*. Such implementations can improve manufacturability of a corresponding semiconductor device, as sensitivity to alignment issues of the implant mask 247 with the (longer) length L1 can be reduced.

Figure 2C:
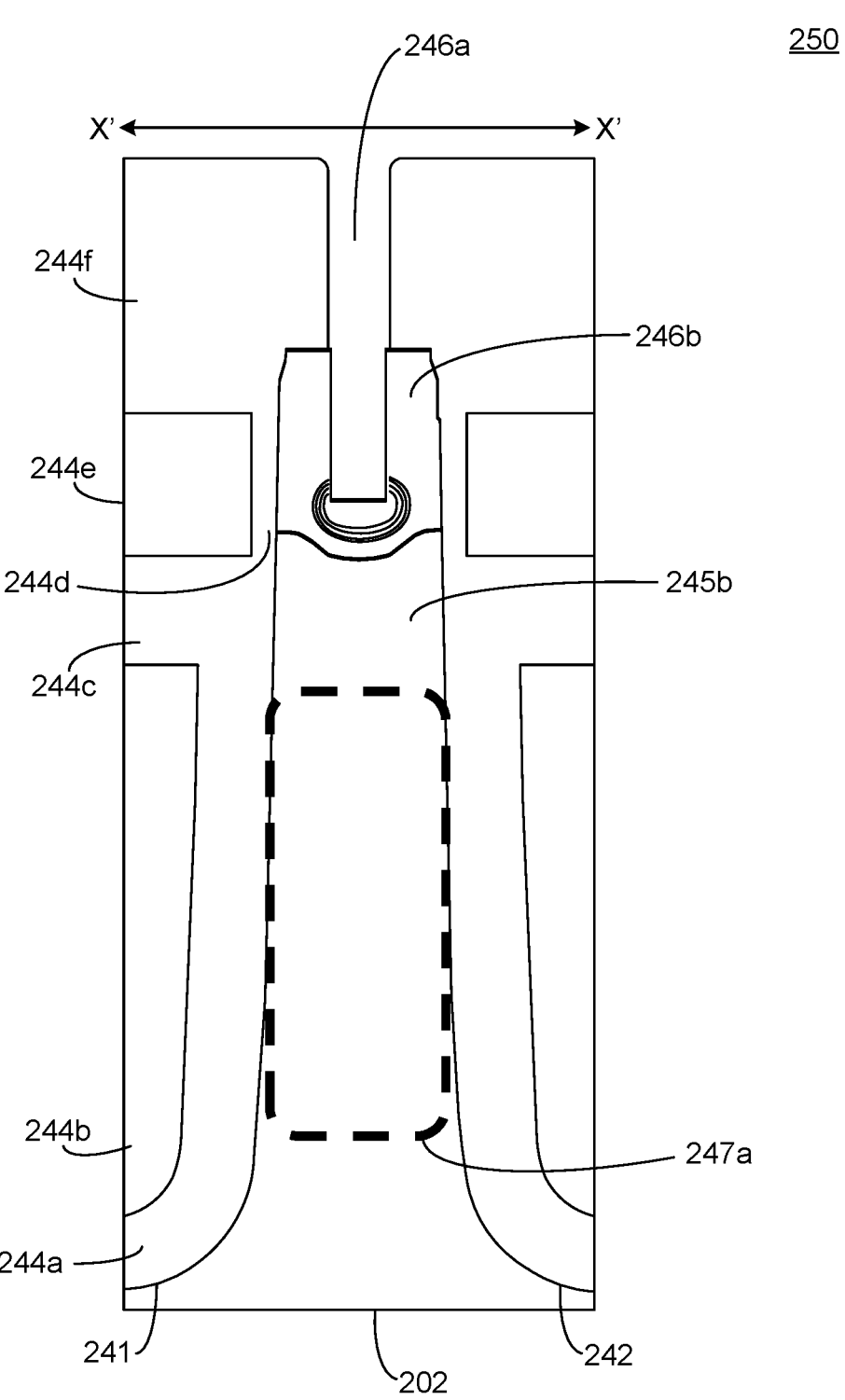
FIG. 2C is a diagram illustrating a cross-sectional view of the vertical transistor of FIG. 2A.

FIG. 2C is a diagram illustrating a cross-sectional view 290 of the vertical transistor of FIG. 2A along the section line X'-X'. As shown in FIG. 2A, the section line X'-X' corresponds with a sectional view from a mid-point of the trench 241, through the distal end portion 245*b* and the contact 246, to a midpoint of the trench 242. Accordingly, in the cross-sectional view 290, only half of the trench 241 and half of the trench 242 are illustrated. In this example, a shielded trench-gate structure is disposed in the trench 241 (and the trench 242). The shielded gate structure includes a shield dielectric 244*a*, a shield electrode 244*b*, an interlayer dielectric 244*c*, a gate dielectric 244*d*, a gate electrode 244*e* and a cap dielectric layer 244*f*.

As shown in FIG. 2C, the distal end portion 245*b* of the semiconductor mesa 245 is defined from a semiconductor region 202. The semiconductor region 202 can be an n-type epitaxial layer, or other semiconductor layer. The semiconductor region 202 can have a doping concentration, which can be referred to as an initial doping concentration, or background doping concentration. As shown in FIG. 2C, the distal end portion 245*b* (and the semiconductor mesa 245) can include an implant region 247*a* that is formed using an implant mask, such as the implant mask 247. A doping concentration of the implant region 247*a* can be of a same conductivity type, e.g., n-type, as the semiconductor region 202 with a higher doping concentration (e.g., twenty percent to one hundred and fifty percent higher) than the initial doping concentration of the semiconductor region 202. The implant region 247*a* is shown by way of illustration and, in some implementations, can have different arrangements. For instance, the implant region 247*a* could be smaller or larger, and/or could be differently located in the distal end portion 245*b* (and the semiconductor mesa 245), such as closer a source and body region 246*b*, or closer to a bottom, or base of the semiconductor mesa 245. FIG. 2C also illustrates a contact opening 246*a* that can be used to contact source metal to the source and body region 246*b*.

FIG. 3 is a diagram illustrating a portion 160*a* of a vertical transistor, such as the vertical transistor of FIG. 1A. The portion 160*a*, as noted above, corresponds with the inset 160 in FIG. 1A, and includes portions of the active area 125*a*, the intersecting trench 115*c*, the pass through area 120*b*, the intersecting trench 115*d*, and the active area 125*b*, which are indicated in FIG. 3.

As shown in FIG. 3, the active area 125*a* and the active area 125*b* include active transistor segments 325. In FIG. 3, only portions of the active transistor segments 325 are shown, and the active transistor segments 325 can extend from the active area 125*a* (e.g., towards the top of the page), and extend from the active area 125*b* (e.g., towards the bottom of the page).

The pass through area 120*b*, in the example of FIG. 3, includes shield electrode contacts 348, where the shield electrode comes to a top of a corresponding trench, such that it can be contacted to source metal (e.g., interrupting a gate electrode conductor in those trenches). The pass through area 120*b* also includes gate pass through trenches 349 in parallel with the trenches including the shield electrode contacts 348. In this example, the gate pass through trenches 349 include uninterrupted gates electrode conductor segments that electrically couple gate electrodes in the active area 125*a* with gate electrodes in the active area 125*b*. In example implementations, such as the semiconductor device 100 of FIG. 1A, the gate electrodes of the active area 125*a*, the pass through area 120*b*, and the active area 125*b*, as well as gate electrode conductors in other areas of the semiconductor device 100, can be contacted to gate runners in the gate runner area 110*a* and the gate runner area 110*b* of the semiconductor device 100. In such implementations, additional gate runners, e.g., due to including multiple shield contacts, e.g., in pass through areas 120*a*, 120*b* and 120*c*, can be excluded due to the use of the gate pass through trenches 349. Source metal can be contact to source/body regions via contacts 346.

Figures 4A, 4B, 4C:
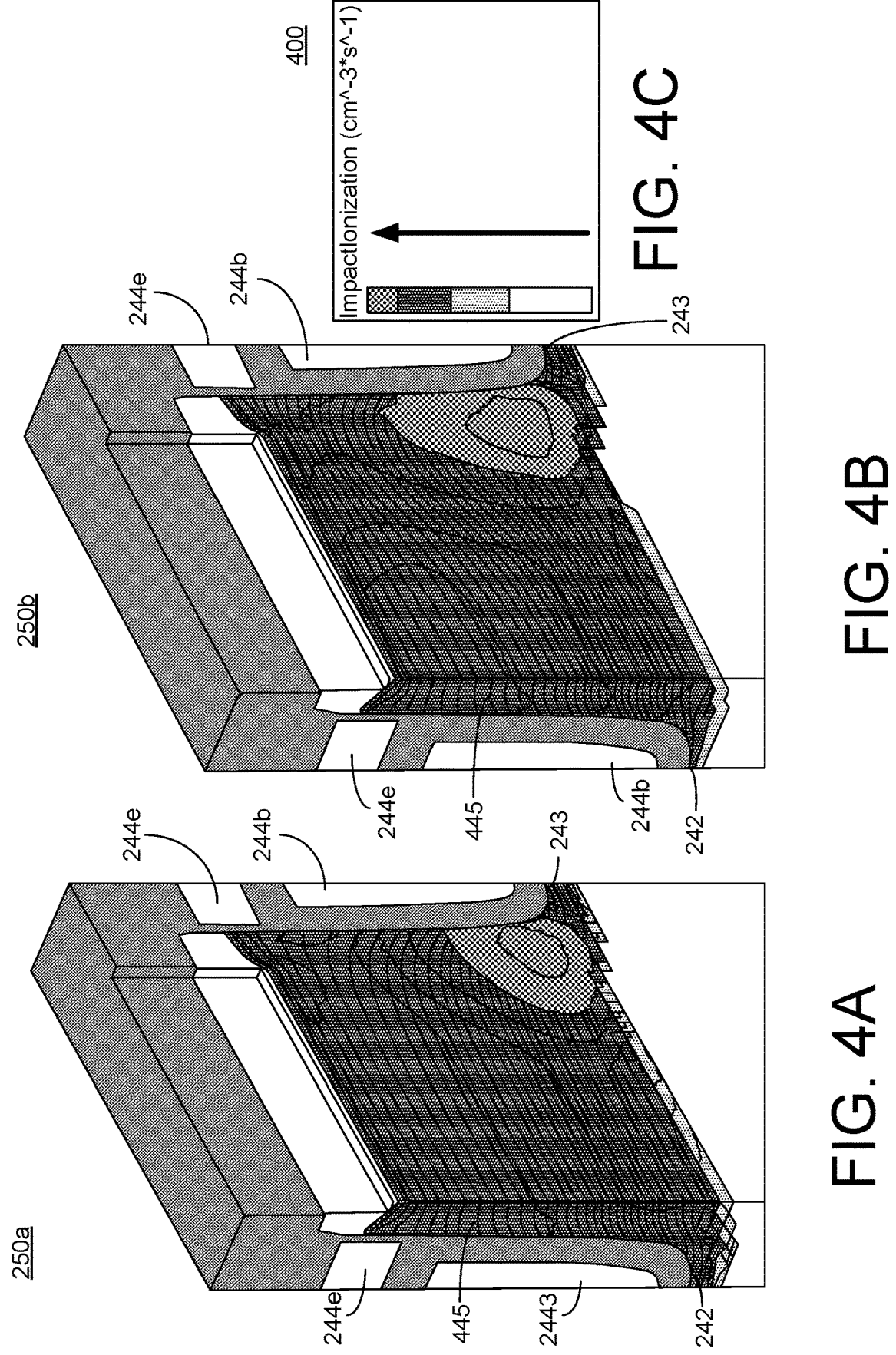
FIGS. 4A and 4B are diagram illustrating perspective views of a portion the vertical transistor of FIG. 2A showing impact ionization without (FIG. 4A) and with (FIG. 4B) an implant to increase doping concentration at ends of semiconductor mesas of the transistor.
FIG. 4C is a diagram illustrating an impact ionization legend corresponding with FIGS. 4A and 4B.

FIGS. 4A and 4B are diagrams illustrating perspective views of a portion of the vertical transistor of FIG. 2A showing impact ionization without (FIG. 4A), and with (FIG. 4B) an implant to increase doping concentration at ends of semiconductor mesas of the transistor (e.g., at trench intersections). The perspective views of FIGS. 4A and 4B, as noted above, correspond with the inset 250 in FIG. 2A. FIG. 4C illustrates a legend 400 corresponding with the impact ionization diagrams of the FIGS. 4A and 4B, with the arrow in FIG. 4C indicating increasing impact ionization levels, which directly correlate with breakdown voltage.

For comparison with FIGS. 2A and 2C, the diagrams of FIGS. 4A and 4B include references to the trench 242, the trench 243, the shield electrode 244*b* and the gate electrode 244*e*. In this example, the shield electrode 244*b* in the trench 242 and the trench 243 is continuous (e.g., is fluidically connected) and, for purposes of illustration, is referenced as a single electrode. Likewise in this example, the gate electrode 244*e* in the trench 242 and the trench 243 is continuous (e.g., is fluidically connected) and, for purposes of illustration, is referenced as a single electrode. In FIGS. 4A and 4B, the intersection of the trench 242 and the trench 243 is illustrated, along with a semiconductor mesa 445 that is defined, in part, by the trench 242 and the trench 243.

FIG. 4A, as noted above, illustrates a portion 250*a* of a vertical transistor corresponding with the inset 250 in FIG. 2A without an implant at an end, e.g., a distal end, of the semiconductor mesa 445 adjacent to the intersection of the trench 242 with the trench 243. FIG. 4B, as also noted above, illustrates a portion 250*b* of a vertical transistor corresponding with the inset 250 in FIG. 2A with an implant at an end, e.g., a distal end, of the semiconductor mesa 445 adjacent to the intersection of the trench 242 with the trench 243.

As can be seen in FIG. 4A, with further reference to FIG. 4C, the highest levels of impact ionization are concentrated at the lower portion of the semiconductor mesa 445 near the intersection of the trench 242 with the trench 243, which indicates rapid depletion of the semiconductor mesa 445. In comparison, as shown in FIG. 4B, with further reference to FIG. 4C, impact ionization levels are more distributed in the semiconductor mesa 445 at the intersection of the trenches, and can approximate impact ionization level that occur in a central portion of the semiconductor mesa 445. Accordingly, the breakdown voltage of the portion 250*b* in FIG. 4B can be increased as compared to the breakdown voltage of the portion 250*a* in FIG. 4A. In this example, the breakdown voltage of the portion 250*b* can be fifteen percent or more than the breakdown voltage of the portion 250*a*.

Figures 5A, 5B, 5C:
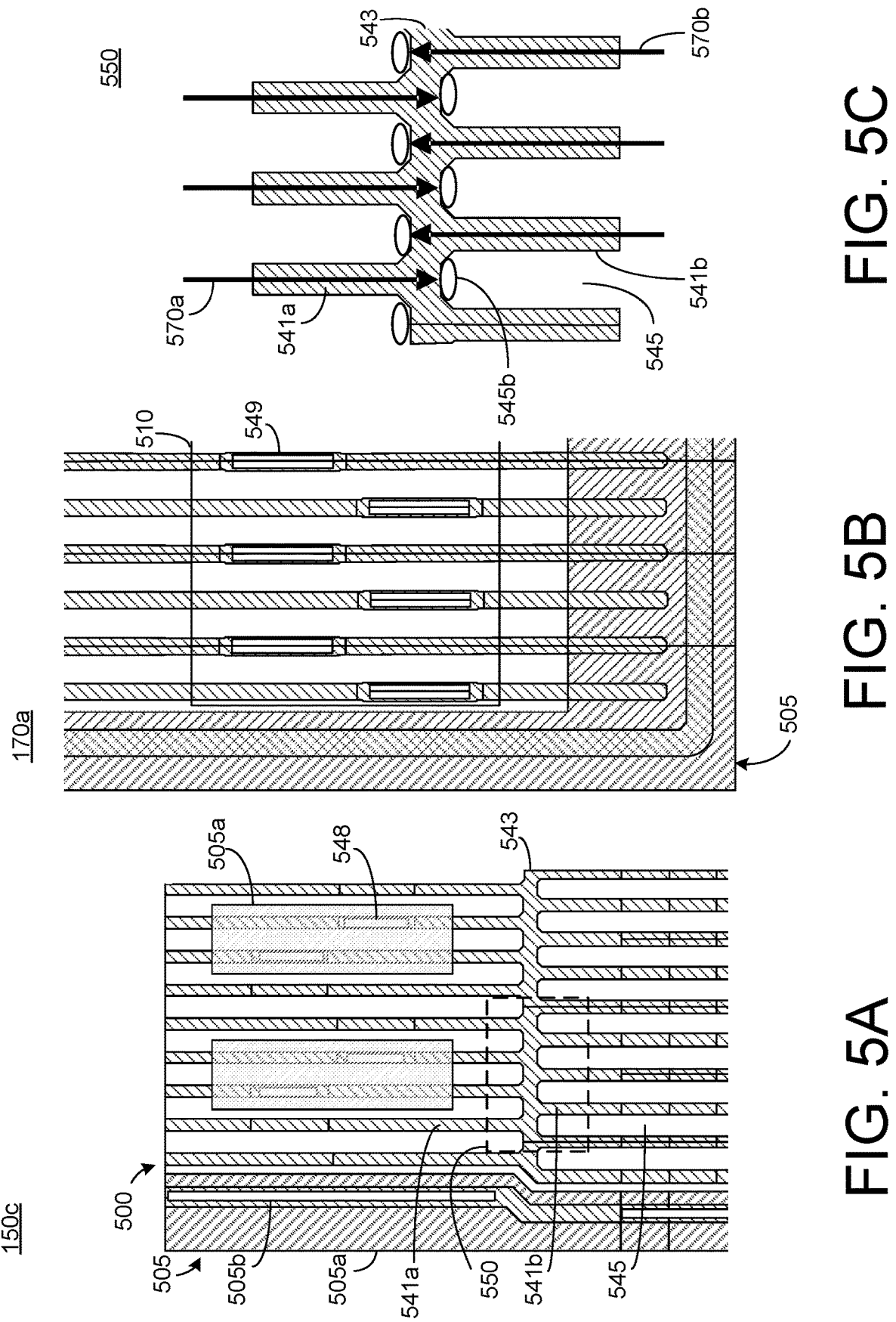
FIGS. 5A and 5B are diagrams illustrating respective portions of a vertical transistor, such as the vertical transistor of FIG. 1A.
FIG. 5C is a diagram illustrating an approach for implantation of proximal and distal end portions of semiconductor mesas of a portion of the vertical transistor of FIG. 5A.

FIG. 5A is a diagram illustrating a portion 150*c* of a vertical transistor, such as the vertical transistor of FIG. 1A. The portion 150*c*, as noted above, corresponds with the inset 150 in FIG. 1A, and, similar to the portion 150*a* of FIG. 2A and the portion 150*b* of FIG. 2B, includes portions of the die termination 105 (referenced as die termination 505), the pass through area 120*b*, the intersecting trench 115*b*, and the active area 125*b*, which are not all specifically referenced again in FIG. 5A. The die termination 505, as with the die termination 105, can include one or more termination structures, where the specific termination structures can depend on the particular implementation. For instance, in this example, a mask 505*a* indicates that a shield electrode (e.g., shield poly) is not etched in the die termination 505. Accordingly, the shield electrode will extend to a top of a trench 505*b* in the die termination 505, such that it can be contacted to source metal (e.g., electrically grounded).

As shown in FIG. 5A, the pass through area 120*b* can include shield contacts 548. As shown in FIG. 5A, the mask 505*a* can also be used to prevent etching of the shield electrode in a portion of the pass through area 120*b* (and other pass through areas) corresponding with the shield contacts 548, such that it can be contacted to source metal. In this example, the shield contacts 548 are arranged in a staggered configuration, e.g., due to the widening of the trenches associated with formation of the shield contacts 548. In some implementations, the shield contacts 548 can be side-by-side (left to right), e.g., where associated trenches are not widened where shield contacts 548 are formed.

In the portion 150*c* of FIG. 5A, trenches, e.g., vertically arranged trenches, on either side of an intersecting trench 543 can be implemented in a staggered, or offset arrangement. For instance, in the portion 150*c*, by way of example, a trench 541*a* is offset (left to right) from a trench 541*b*, with other trenches of the pass through area 120*b* and the active area 125*b* being similarly arranged. For instance, as result of this staggered arrangement, an end of a semiconductor mesa 545 is linearly aligned with the trench 541*a*. In this arrangement, angled implants can be performed to dope the ends of the semiconductor mesas on opposite sides of the intersecting trench 543, such as illustrated in FIG. 5C.

FIG. 5B is a diagram illustrating a portion 170*a* of a vertical transistor, such as the vertical transistor of FIG. 1A. The portion 170*a*, as noted above, corresponds with the inset 170 in FIG. 1A, and includes portions of the die termination 505 (a corner of the die termination 505), and the gate runner area 110*b*. As shown in FIG. 5B, the gate runner area 110*b* includes gate electrode contacts 549, which can be contacted to gate runner metal 510.

FIG. 5C is a diagram illustrating an approach for implantation of proximal and distal end portions of semiconductor mesas of the vertical transistor of FIG. 5A without use of an implant mask. Specifically, FIG. 5C illustrates implantation of semiconductor mesas in the portion of the vertical transistor of FIG. 5A corresponding with the inset 550. As shown in FIG. 5C, in this example, an implant 570*a* can be performed in a first direction, e.g., in a direction parallel with the trench 541*a*, to implant distal end portions of semiconductor mesas that are illustrated below the intersecting trench 543 in FIG. 5C, as well as other similarly arranged semiconductor mesas in other areas of a corresponding semiconductor device. For instance, as shown in FIG. 5C, an impurity implant 545b can be formed in a distal end portion of the semiconductor mesa 545 by the implant 570a.

Also in this example, an implant 570b can be performed in a direction opposite to that of the implant 570a, e.g., in a direction parallel with the trench 541b. The implant 570b can implant proximal end portions of semiconductor mesas that are illustrated above the intersecting trench 543 in FIG. 5C, as well as other similarly arranged semiconductor mesas in other areas of a corresponding semiconductor die, such as a proximal end portion the semiconductor mesa 545 (not shown in FIG. 5C). In example implementations, the implant 570a and the implant 570b can be performed at respective angles that are between thirty and sixty degrees relative to a line that is orthogonal to a surface of the corresponding semiconductor device, e.g., a line that is perpendicular to the page in the view of FIG. 5C.

Due to the staggered arrangement of the trenches and semiconductor mesas in this example, as well as the respective directions of the implant 570a and the implant 570b, the entire height of the semiconductor mesas can be implanted along their sidewalls at their proximal ends and distal ends of the semiconductor mesas. That is, the end portions (proximal and distal end portions) of the mesas can be implanted without using an implant mask, such as the implant mask 247 of the example of FIGS. 2A-2C.

In such approaches, portions of the implant 570a and the implant 570b will go into bottom surface of the trenches and, as a result, can change a doping concentration present at the trench bottoms. In some implementations, this change in doping concentration at the trench bottoms can affect operation of an associated transistor. Accordingly, in some implementations, one or more measures can be taken to compensate for this change. For instance, a blanket implant used to dope a semiconductor region in which a corresponding semiconductor device including a vertical transistor is formed can be adjusted. As another example, an anisotropic etch of the trench bottoms can be performed, where the etch removes semiconductor material, and/or a sacrificial material from the trench bottoms, such as further discussed with respect to FIGS. 11 and 12 below. In the approach of FIG. 5C, implantation of upper surfaces of the semiconductor mesas can be blocked a hard mask, e.g., a hard mask that is also used for trench formation.

Figures 6A, 6B:
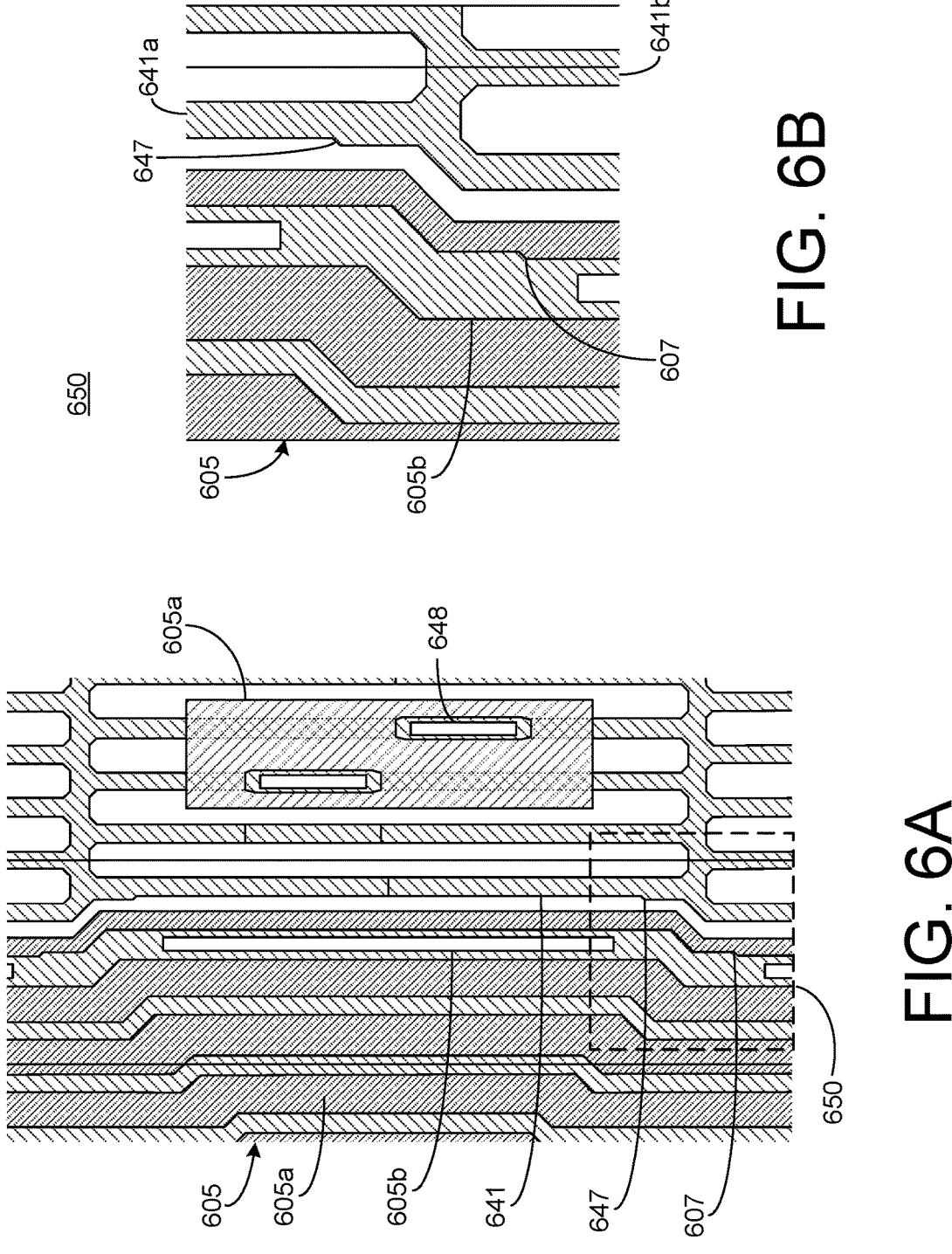
FIG. 6A is a diagram illustrating a portion of a vertical transistor, such as the vertical transistor of FIG. 1A.
FIG. 6B is a diagram illustrating a portion of the vertical transistor of FIG. 6A.

FIG. 6A is a diagram illustrating a portion 150d of a vertical transistor, such as the vertical transistor of FIG. 1A. FIG. 6B is a diagram illustrating a portion of the vertical transistor of FIG. 6A corresponding with the inset 650. The portion 150d, as noted above, corresponds with the inset 150 in FIG. 1A, and, similar to the portion 150a of FIG. 2A and the portion 150b of FIG. 2B, includes portions of the die termination 105 (referenced as die termination 605), the pass through area 120b, the intersecting trench 115b, and the active area 125b, which are not all specifically referenced again in FIG. 6A.

In this example, as with the die termination 505, the die termination 605 can include one or more termination structures, where the specific termination structures can depend on the particular implementation. For instance, in this example, a mask 605a indicates that a shield electrode (e.g., shield poly) is not etched in the die termination 605. Accordingly, the shield electrode will extend to a top of a trench 605b in the die termination 605, such that it can be contacted to source metal (e.g., electrically grounded). The die termination 605 in FIG. 6A also includes other trenches where shield electrode (e.g., shield poly) is not contacted, e.g., can be electrically floating.

As shown in FIG. 6A, the pass through area 120b can include shield contacts 648. As shown in FIG. 6A, the mask 605a can also be used to prevent etching of the shield electrode in a portion of the pass through area 120b (and other pass through areas) corresponding with the shield contacts 648, such that it can be contacted to source metal. In this example, the shield contacts 648 are arranged in a staggered configuration, such as with the shield contacts 548 in FIG. 5A. In some implementations, other arrangements of the shield contacts 648, e.g., side-by-side arrangement, can be used.

As shown in FIGS. 6A and 6B, the portion 150d differs from the portion 150c of FIG. 5A in that the trench 605b of the die termination 605 and a trench 641 (e.g., an outermost vertically arranged trench of a plurality of perpendicularly intersecting trenches) include, respectively, a notch 607 and a notch 647. In this example, the notch 607 and the notch 647 can control an amount of dopant that is implanted in semiconductor mesas that are linearly aligned with those trenches.

Figure 7:
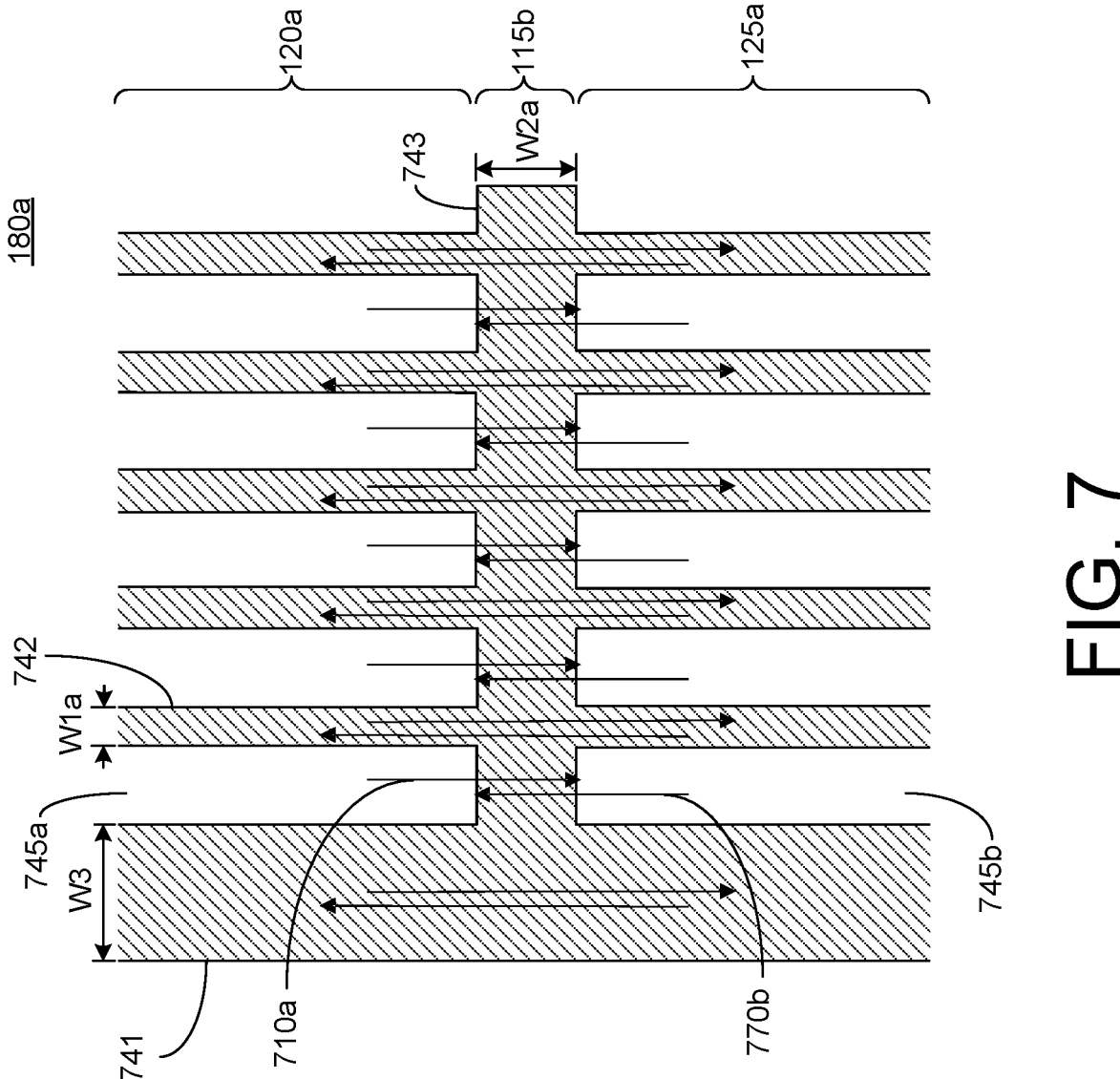
FIG. 7 is a diagram illustrating another approach for implantation of proximal and distal end portions of semiconductor mesas of a portion of a vertical transistor, such as the vertical transistor of FIG. 1A.

FIG. 7 is a diagram illustrating another approach for implantation of proximal and distal end portions of semiconductor mesas of a portion 180a of a vertical transistor, such as the vertical transistor of FIG. 1A, without use of an implant mask. The portion 180a, as noted above, corresponds with the inset 180 in FIG. 1A, and includes portions of the pass through area 120a, the intersecting trench 115b, and the active area 125a, each of which are indicated in FIG. 7. In this example, the portion 180a includes a plurality of perpendicularly intersecting trenches that are similarly arranged to the trenches of the portion 140a of FIG. 1B. For instance, the portion 180a in FIG. 7 includes a trench 741 (e.g., this is an outermost vertically arranged trench), a trench 742 parallel to the trench 741, and a trench 743 (e.g., an intersecting trench) that is perpendicular to the trench 741 and the trench 742. In the example of FIG. 7, semiconductor mesas on opposite sides of the trench 743 are linearly aligned with one another, such as in the example of FIG. 1B. For instance, as shown in FIG. 7, a semiconductor mesa 745a on a first side of the trench 743 is linearly aligned with a semiconductor mesa 745b on an opposite side of the trench 743, with other semiconductor mesas being similarly arranged.

As shown in FIG. 7, the trench 742 can have a width W1a, the trench 743 can have a width W2a, and the trench 741 can have a width W3. In some implementations, the width W2a can be greater than the width W1a, and the width W3 can be greater than or equal to the width W2a. In other implementations, the width W1a, the width W2a, and the width W3 can be a same width.

As shown in FIG. 7, in this example, an implant 770a can be performed in a first direction, e.g., in a direction parallel with the trench 741 and the trench 742, to implant distal end portions of semiconductor mesas that are illustrated below the trench 743 in FIG. 7, as well as other similarly arranged semiconductor mesas in other areas of a corresponding semiconductor device. For instance, the implant 770a can implant impurities (e.g., n-type impurities, such as arsenic and/or phosphorous) in a distal end portion of the semiconductor mesa 745b to increase a doping concentration of the distal end portion, e.g., by twenty percent to one hundred and fifty percent relative to an initial doping concentration of a semiconductor region from which the semiconductor mesas are formed.

Also in this example, an implant 770*b* can be performed in a direction opposite to that of the implant 770*a*, e.g., in a direction parallel with the trench 741 and the trench 742. The implant 770*b* can implant proximal end portions of semiconductor mesas that are illustrated above the trench 743 in FIG. 7, as well as other similarly arranged semiconductor mesas in other areas of a corresponding semiconductor die, such as a proximal end portion the semiconductor mesa 745*a*.

In example implementations, the implant 770*a* and the implant 770*b* can be performed at respective angles that are between five and thirty degrees relative to a line that is orthogonal to a surface of the corresponding semiconductor device, e.g., a line that is perpendicular to the page in the view of FIG. 7. In this example, an angle at which the implant 770*a* and the implant 770*b* can depend on height of the mesa being implant plus a thickness of a hard mask disposed on an upper surface of the mesa (e.g., which can block implantation of the upper surface), and the width W2*a* of the trench 743. For instance, an implant angle should be selected that results in the entire height of the ends of the semiconductor mesas receive the implant, from either the implant 770*a* or the implant 770*b*.

In such approaches, as with the example of FIG. 5C, portions of the implant 770*a* and the implant 770*b* will go into bottom surface of at least some of the trenches, e.g., the vertically arranged trenches including the trench 741 and the trench 743 and, as a result, can change a doping concentration present at the corresponding trench bottoms. In some implementations, this change in doping concentration at the trench bottoms can affect operation of an associated transistor. Accordingly, in some implementations, as was discussed with respect to FIG. 5C, one or more measures can be taken to compensate for this change, such as adjusting a blanket implant and/or performing an anisotropic etch on the trench bottoms. In the approach of FIG. 7, implantation of upper surfaces of the semiconductor mesas can be blocked a hard mask, e.g., a hard mask that is also used for trench formation.

Figure 8:
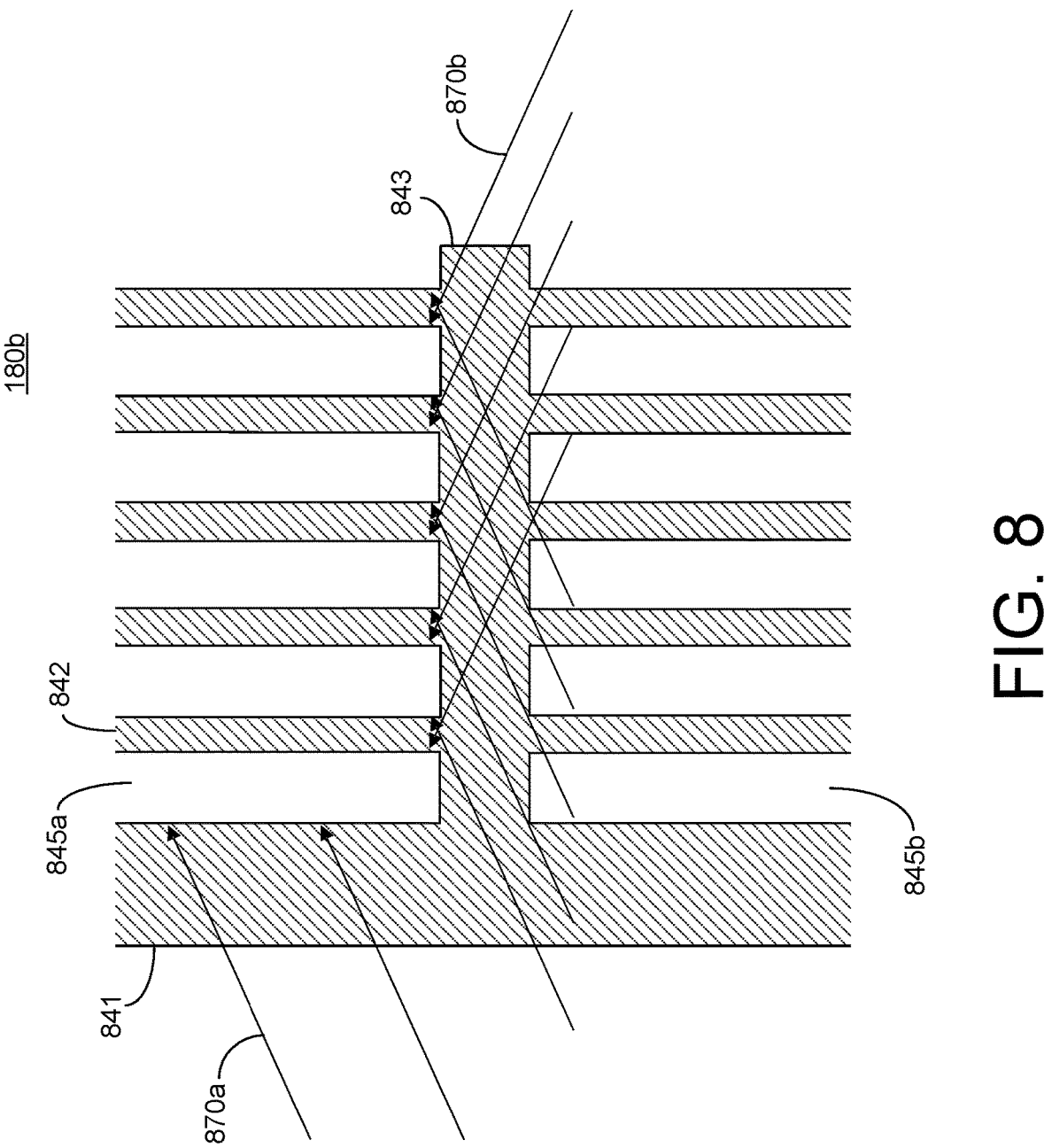
FIG. 8 is a diagram illustrating another approach for implantation of proximal and distal end portions of semiconductor mesas of a portion of a vertical transistor, such as the vertical transistor of FIG. 1A.

FIG. 8 is a diagram illustrating another approach for implantation of proximal and distal end portions of semiconductor mesas of a portion 180*b* of a vertical transistor, such as the vertical transistor of FIG. 1A. As with the portion 180*a* of FIG. 7, the portion 180*b*, as noted above, corresponds with the inset 180 in FIG. 1A, and includes portions of the pass through area 120*a*, the intersecting trench 115*b*, and the active area 125*a*, which are not indicated again in FIG. 8. In this example, the portion 180*b* includes a plurality of perpendicularly intersecting trenches that are in a same arrangement as the trenches of the portion 180*a* of FIG. 7. For instance, the portion 180*b* in FIG. 8 includes a trench 841 (e.g., this is an outermost vertically arranged trench), a trench 842 parallel to the trench 741, and a trench 843 (e.g., an intersecting trench) that is perpendicular to the trench 841 and the trench 842. As in the example of FIG. 7, semiconductor mesas on opposite sides of the trench 843 in the portion 180*b* are linearly aligned with one another. For instance, as shown in FIG. 8, a semiconductor mesa 845*a* on a first side of the trench 843 is linearly aligned with a semiconductor mesa 845*b* on an opposite side of the trench 843, with other semiconductor mesas being similarly arranged. The trenches in the portion 180*b* of FIG. 8 can have width relationships such as those discussed above with respect to FIG. 7.

As shown in FIG. 8, in this example, an implant 870*a* can be performed in a first direction that is at an angle between thirty degrees and sixty degrees relative to a vertical line that is orthogonal to an upper surface of the semiconductor device and at an angle that is between fifteen degrees and thirty degrees relative to a longitudinal axis of the trench 843. As further shown in FIG. 8, an implant 870*b* can be performed using the same angles as the implant 870*a* from an opposite direction from the implant 870*a*. In this example, the implant 870*a* and the implant 870*b* can be used to implant proximal end portions of semiconductor mesas that are illustrated above the trench 843 in FIG. 8, as well as other similarly arranged semiconductor mesas in other areas of a corresponding semiconductor device. For instance, the implant 870*a* can implant impurities (e.g., n-type impurities, such as arsenic and/or phosphorous) in a proximal end portion of the semiconductor mesa 845*a* to increase a doping concentration of the proximal end portion, e.g., by twenty percent to one hundred and fifty percent relative to an initial doping concentration of a semiconductor region from which the semiconductor mesas are formed. In the example, distal end portions of semiconductor mesa can be implanted at the same angles as the implant 870*a* and the implant 870*b* with the respective direction of those implants being rotated one hundred eight degrees relative the portion 180*b*.

In such approaches, portions of the implants described above will go into bottom surface of at least some of the trenches and/or portions of the trenches, e.g., the vertically arranged trenches including the trench 841, and intersecting trenches including the trench 843, as well as portions of longitudinal (e.g., vertically arranged) sidewalls of the semiconductor mesas and, as a result, can change a doping concentration present at the corresponding trench bottoms and longitudinal sidewalls. In some implementations, this change in doping concentration can affect operation of an associated transistor. Accordingly, in some implementations, as was discussed with respect to FIG. 5C and FIG. 7, one or more measures can be taken to compensate for this change.

Figure 9:
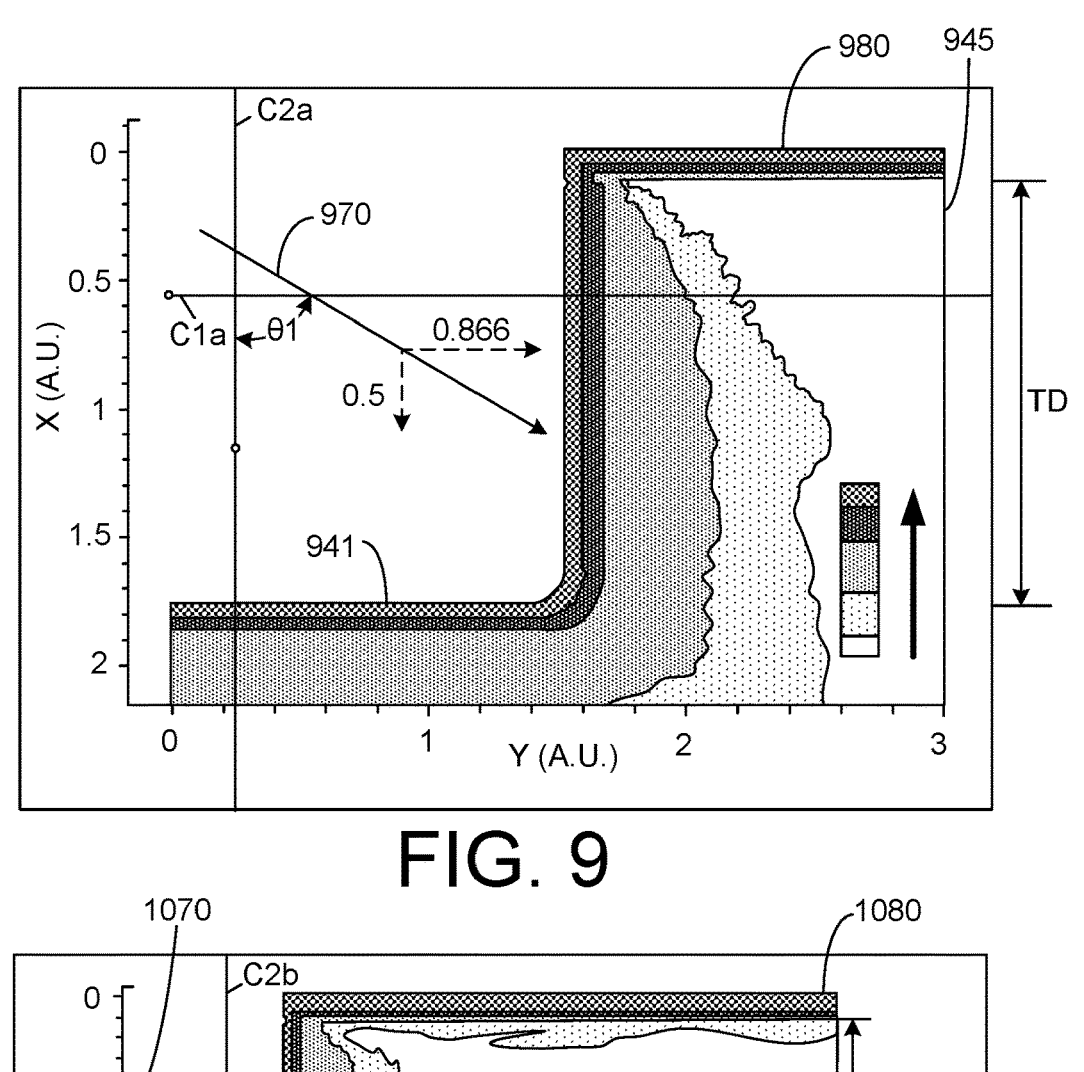
FIG. 9 is a diagram illustrating implantation of an end portion of a semiconductor mesa of a vertical transistor, such as the vertical transistor of FIG. 5A.

FIG. 9 is a diagram illustrating implantation of an end portion of a semiconductor mesa of a vertical transistor, such as the vertical transistor of FIG. 5A. For instance, FIG. 9 illustrates a trench 941 and a semiconductor mesa 945, where the trench 941 can correspond with the trench 541*a* in FIG. 5C, and the semiconductor mesa 945 can correspond with the semiconductor mesa 545 in FIG. 5C. In FIG. 9, a line C1*a* indicates a longitudinal axis of the trench 941 and the semiconductor mesa 945, which are linearly aligned, e.g., can have a common longitudinal axis. A line C2*a* in FIG. 9 is orthogonal to a bottom surface of the trench 941 (e.g., and also orthogonal to a plane defined by an upper surface of the semiconductor mesa 945. In FIG. 9, X is distance along the line C2*a* in arbitrary units (A.U.), and Y is distance along the line C1*a* in A.U.

In this example, an implant 970, which can be an arsenic implant corresponding with the implant 570*a* in FIG. 5C, can be performed (with a given energy and dose) along a direction parallel with the line C1*a*, at an angle θ1 relative to the line C2*a*. In this example, θ1 is sixty degrees. As shown in FIG. 9, using trigonometry and by calculating the sine of θ1 of sixty degrees, it can be determined that 86.6% of the dose of the implant 970 will be incident on the distal end of the semiconductor mesa 945, e.g., along the line C1*a*. Further, by calculating the cosine of θ1 of sixty degrees, it can be determined that 50% of the dose of the implant 970 will be incident on the bottom surface of the trench 941, e.g., along the line C2*a*.

An arsenic doping concentration profile of the semiconductor mesa 945 and the bottom of the trench 941 resulting from the implant 970 is shown in FIG. 9, with the legend of FIG. 9 indicating relative arsenic concentrations, In the legend, the arrow indicates the direction of increasing arsenic concentrations. As can be seen in FIG. 9, there is significant arsenic doping in both the end portion (distal end portion in this example) of the semiconductor mesa 945, as well as in the bottom of the trench 941. As described herein, e.g., with respect to FIGS. 11 and 12, measures can be taken to remove, or prevent at least a portion of the arsenic doping in the bottom of the trench 941, such as in the example of FIG. 9.

In this example, a hard mask material 980 can be disposed on an upper surface of the semiconductor mesa 945. The hard mask material 980 can block the implant 970, as well as a complementary implant (corresponding with the implant 570$b$) from an opposite direction of the implant 970 used to implant opposite an opposite end (a proximal end) of the semiconductor mesa 945, and similarly implant proximal ends of other semiconductor mesas. After completing implantation of end portions (both the distal end portions and the proximal end portion) of the semiconductor mesa 945 (and end portions of other semiconductor mesas of a corresponding vertical transistor), the hard mask material 980 can be removed.

Figure 10:
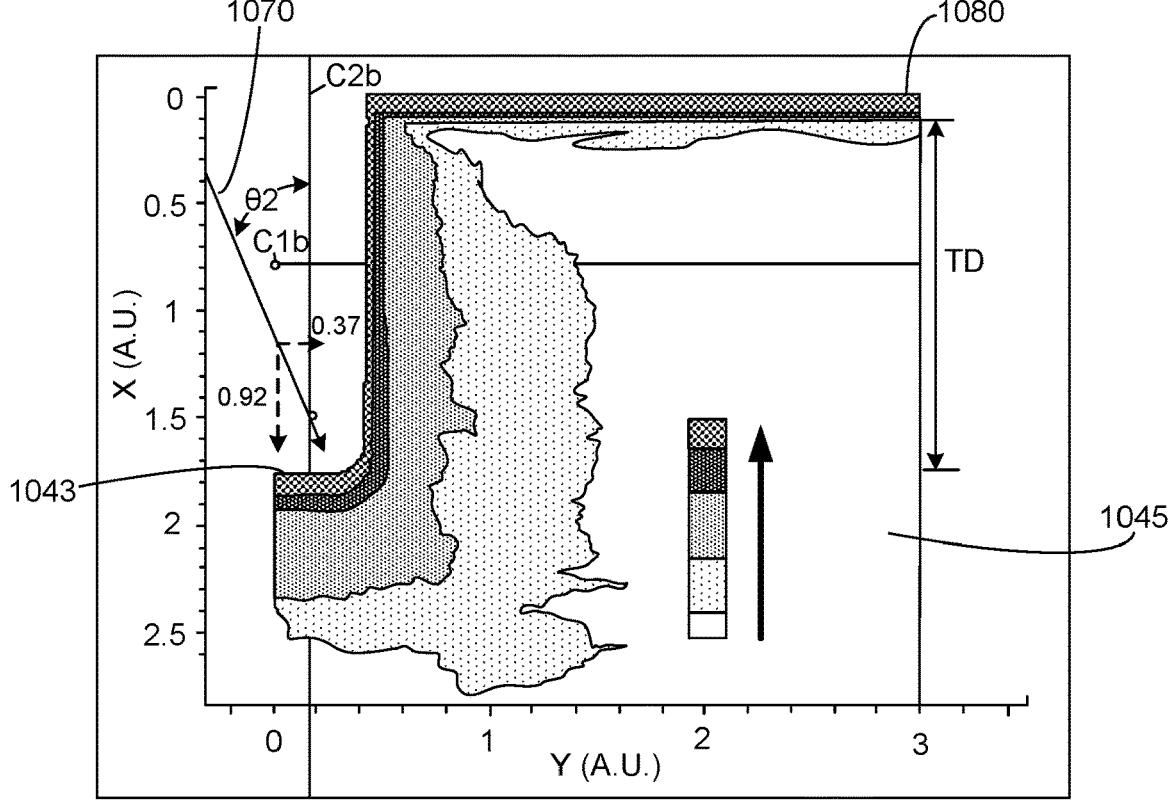
FIG. 10 is a is a diagram illustrating implantation of an end portion of a semiconductor mesa of a vertical transistor, such as the vertical transistor of FIG. 7.

FIG. 10 is a diagram illustrating implantation of an end portion of a semiconductor mesa of a vertical transistor, such as the vertical transistor of FIG. 7. For instance, FIG. 10 illustrates a trench 1043 and a semiconductor mesa 1045, where the trench 1043 can correspond with the trench 743 in FIG. 7, and the semiconductor mesa 1045 can correspond with the semiconductor mesa 745$b$ in FIG. 7. In FIG. 10, a line C1$b$ indicates a longitudinal axis of the semiconductor mesa 945, and is orthogonal to an longitudinal axis of the trench 1043. A line C2$a$ in FIG. 10 is orthogonal to a bottom surface of the trench 1043 (e.g., and also orthogonal to a plane defined by an upper surface of the semiconductor mesa 1045. In FIG. 10, X is distance along the line C2$b$ in arbitrary units (A.U.), and Y is distance along the line C1$a$ in A.U.

In this example, an implant 1070, which can be an arsenic implant corresponding with the implant 770$a$ in FIG. 7, can be performed (with a given energy and dose) along a direction parallel with the line C1$b$, at an angle θ1 relative to the line C2$a$. In this example, θ1 is twenty-two degrees, which can be based on a width of the 1043, e.g., to prevent shadowing of the implant 1070 at the lower portion of the semiconductor mesa 1045. As shown in FIG. 10, by calculating the sine of θ1 of twenty-two degrees, it can be determined that 37.4% of the dose of the implant 1070 will be incident on the distal end of the semiconductor mesa 1045, e.g., along the line C1$b$. Further, by calculating the cosine of θ1 of twenty-two degrees, it can be determined that 92.7% of the dose of the implant 1070 will be incident on the bottom surface of the trench 1043, e.g., along the line C2$a$.

An arsenic doping concentration profile of the semiconductor mesa 1045 and the bottom of the trench 1043 resulting from the implant 1070 is shown in FIG. 10, with the legend of FIG. 10 indicating relative arsenic concentrations, In the legend, the arrow indicates the direction of increasing arsenic concentrations. As can be seen in FIG. 10, there is significant arsenic doping in both the end portion (distal end portion in this example) of the semiconductor mesa 1045 (though less than the semiconductor mesa 945 of FIG. 9), as well as in the bottom of the trench 1043 (more than the bottom of the trench 941 in FIG. 9). As described herein, e.g., with respect to FIGS. 11 and 12, measures can be taken to remove, or prevent at least a portion of the arsenic doping in the bottom of the trench 1042, such as in the example of FIG. 10.

In this example, a hard mask material 1080 can be disposed on an upper surface of the semiconductor mesa 1045. The hard mask material 1080 can block the implant 1070, as well as a complementary implant (corresponding with the implant 770$b$) from an opposite direction of the implant 1070 used to implant opposite an opposite end (a proximal end) of the semiconductor mesa 1045, and similarly implant proximal ends of other semiconductor mesas. After completing implantation of end portions (both the distal end portions and the proximal end portion) of the semiconductor mesa 1045 (and end portions of other semiconductor mesas of a corresponding vertical transistor), the hard mask material 1080 can be removed.

Figure 11:
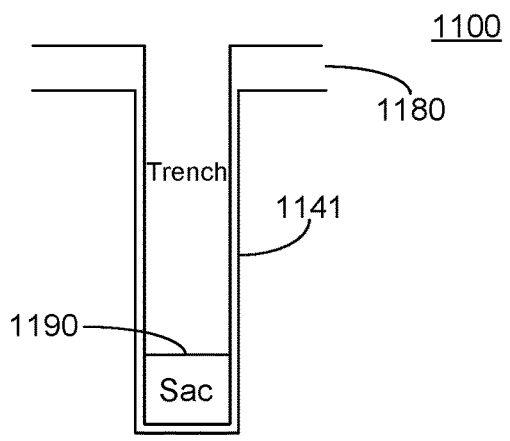
FIG. 11 is a diagram schematically illustrating use of a sacrificial material to block doping of a trench bottom.

FIG. 11 is a diagram schematically illustrating use of a sacrificial material to block doping of a trench bottom. In the example of FIG. 11, a trench 1141 is illustrated. The trench 1141 can represent a trench of a plurality of intersecting trenches in a vertical transistor semiconductor device, such as in the examples described herein. For instance, referring to the example of FIG. 1B, the trench 1141 could be any one of the trench 141, the trench 142, the trench 143, or the trench 144. In other examples, the trench 1141 could implement other trenches, such as those described herein.

As shown in FIG. 11, a hard mask material 1080 can be disposed on upper surfaces of semiconductor mesas (not specifically referenced in FIG. 11) disposed on either side of the trench 1141. In this example, and as described herein, the hard mask material 1080 can be used for trench formation, as well as an implant block for mesa end portion implant operations, such as those described with respect to FIGS. 5C, 7, 8, 9 and 10.

In the example of FIG. 11, prior to performing such mesa end portion implant operations, a sacrificial material 1190 can be disposed in a lower portion of the trench 1141. In some implementations, the sacrificial material 1190 can be an organic material, a photoresist, polysilicon, a nitride, etc. In example implementations, the sacrificial material 1190 can block impurities from being implanted in a bottom surface of the trench 1141, such as when performing implant operations described herein, e.g., such as the implant operations of FIGS. 5C, 7, 8, 9 and 10. After completion of those implant operations, the sacrificial material 1190 can be removed from the trench 1141, e.g., to expose the bottom of the trench, In such implementations, the bottom of the trench 1141 can have a doping concentration (e.g., an n-type, such as arsenic, doping concentration) that is consistent with an initial (background) doping concentration of a semiconductor region in which a corresponding vertical transistor is being produced.

Figure 12:
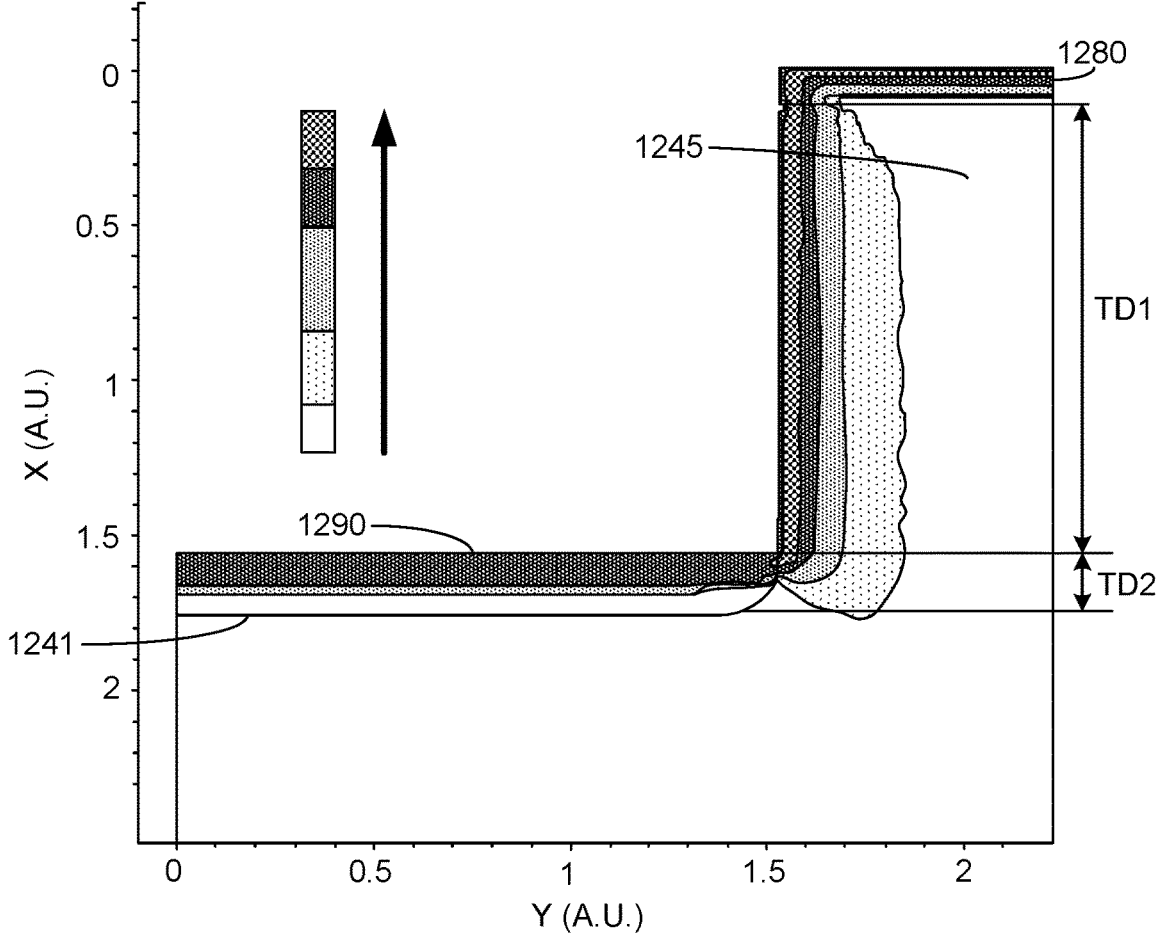
FIG. 12 is a diagram illustrating a trench and corresponding semiconductor mesa prior to removal of impurity implanted material from a lower portion (bottom) of the trench.

FIG. 12 is a diagram illustrating a trench 1241, and corresponding a semiconductor mesa 1245 prior to removal of impurity implanted material from a lower portion (bottom surface) of the trench 1241. A doping profile concentration (e.g., showing arsenic concentration) similar to those shown in FIGS. 9 and 10 is shown in FIG. 12, along with a corresponding legend indicating a direction of increasing doping concentration.

In the example of FIG. 12, a blocking material 1290 is disposed along a bottom surface of the trench 1241. In some implementation, the blocking material 1290 can be a sacrificial material, such as those described above with respect to FIG. 11. In some implementations, the blocking material 1290 can be removed after implant operations are performed to increase doping concentration in end portions of the 1245 (and other semiconductor mesas).

In other implementations, the 1290 can be an unetched portion of a semiconductor region in which the trench 1241 is formed. For instance, in this example, the trench 1241 can be etched using at least two etching operations. A first etching operation can be to a depth TD1, as shown in FIG. 12. After implant operations are performed, such as those described with respect to FIGS. 5C, 7, 8, 9 and 10, a second trench etch can be performed to further etch the trench 1241 to an additional depth of TD2, where a final depth of the trench 1241 is TD1+TD2.

As can be seen in FIG. 12, after removal of the 1290 (whether a sacrificial material, or an etched portion of a corresponding semiconductor region), a doping concentration (e.g., n-type doping concentration) along the bottom surface of the trench can be consistent with an initial doping concentration of the corresponding semiconductor region, e.g., the lowest arsenic doping concentration illustrated in FIG. 12.

FIG. 13 is a flowchart illustrating a method 1300 for producing a semiconductor device, such as the example semiconductor devices described herein. At block 1310, the method 1300 includes defining a semiconductor mesa of a conductivity type in a semiconductor region of the first conductivity type, where the semiconductor mesa has an initial doping concentration. The semiconductor mesa can be defined by forming a plurality of perpendicularly intersecting trenches in the semiconductor region. At block 1320, the method 1300 includes doping a proximal end of the semiconductor mesa with a doping concentration, e.g., that is greater than the initial doping concentration and of the conductivity type of the semiconductor region. At block 1330, the method 1300 includes doping a distal end of the semiconductor mesa with the first doping concentration, e.g., of the conductivity type of the semiconductor region. In some implementations, doping the proximal end at block 1320 and doping the distal end block 1330 can be performed using at least one implant.

For instance, in some implementations, performing the at least one implant can include forming a mask to exclude the at least one implant from the central portion of the semiconductor mesa. After forming the mask, at the at least one implant orthogonal to a surface of the semiconductor region can be performed to dope the proximal end and the distal end (e.g., multiple implants at different respective energies and doses). In some implementations, the at least one implant can be performed after formation of a shield electrode in the plurality of perpendicularly intersecting trenches, or can be performed after formation of the shield electrode and a gate electrode in the plurality of perpendicularly intersecting trenches.

In some implementations, the semiconductor mesa can be aligned along a longitudinal axis, and performing the at least one implant can include performing at least a first implant and a second implant. The first implant can be performed in a first direction parallel to the longitudinal axis. The second implant can be performed in a second direction parallel to the longitudinal axis, and the second direction can be opposite the first direction. In some implementation, the first implant and the second implant can be performed at an angle between twenty degrees and sixty degrees relative to a line that is orthogonal to a surface of the semiconductor region.

In some implementations, prior to performing the at least one implant, a sacrificial material layer can be formed in the plurality of perpendicularly intersecting trenches (e.g., on bottom surfaces of the trenches. After performing the at least one implant, the sacrificial material layer can be removed.

In some implementations, forming the plurality of perpendicularly intersecting trenches at block 1310 can include performing multiple trench etch operations. For instance, prior to performing the at least one implant, a first trench etch to a first depth in the semiconductor region can be performed. After performing the at least one implant, a second trench etch to a second depth in the semiconductor region can be performed, where the second depth is greater than the first depth. The second trench etch can remove implant sacrificial material, and or implanted portions of the semiconductor region along the trench bottoms.

In some implementations, the semiconductor mesa is aligned along a longitudinal axis, and performing the at least one implant can include performing multiple implants. For instance, a first implant can be performed in a first direction that is at an angle of sixty degrees relative to a line that is orthogonal to a surface of the semiconductor region and at an angle that is between ninety and one-hundred and twenty degrees relative to the longitudinal axis. A second implant can be performed in a second direction that is at the angle of sixty degrees relative to the line that is orthogonal to the surface of the semiconductor region and at an angle that is between two-hundred and forty degrees and two-hundred and seventy degrees relative to the longitudinal axis.

It will be understood, for purposes of this disclosure, that when an element, such as a layer, a region, or a substrate, is referred to as being on, disposed on, disposed in, connected to, electrically connected to, coupled to, or electrically coupled to another element, it may be directly on, connected or coupled to the other element, or one or more intervening elements may be present. In contrast, when an element is referred to as being directly on, directly disposed on, directly disposed in, directly connected to or directly coupled to another element or layer, there are no intervening elements or layers present. Although the terms directly on, directly in, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to, vertically adjacent to, or horizontally adjacent to.

Some implementations may be implemented using various semiconductor processing and/or packaging techniques. Some implementations may be implemented using various types of semiconductor processing techniques associated with semiconductor substrates including, but not limited to, for example, silicon (Si), gallium arsenide (GaAs), gallium nitride (GaN), silicon carbide (SiC), and/or so forth.

While certain features of various example implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A vertical transistor comprising:
a semiconductor region of a first conductivity type;
a plurality of perpendicularly intersecting trenches having a shielded gate structure of the vertical transistor disposed therein; and
a mesa of the semiconductor region defined by the plurality of perpendicularly intersecting trenches, the mesa including:
  a first end portion having a first doping concentration of the first conductivity type;
  a second end portion having the first doping concentration of the first conductivity type; and
  a central portion disposed between the first end portion and the second end portion, the central portion having a second doping concentration of the first conductivity type that is less than the first doping concentration.

2. The vertical transistor of claim 1, further comprising:
a body region of the vertical transistor disposed in an upper portion of the mesa, the body region being of a second conductivity type opposite the first conductivity type; and
a source region of the vertical transistor disposed in the body region.

3. The vertical transistor of claim 1, wherein:
the mesa is aligned along a longitudinal axis;
the first end portion has a first length along the longitudinal axis;
the second end portion has the first length along the longitudinal axis; and
the central portion has a second length along the longitudinal axis that is greater than the first length.

4. The vertical transistor of claim 3, wherein:
the first length is less than 0.5 micrometers (µm); and
the second length is greater than 3 µm.

5. The vertical transistor of claim 1, wherein the first doping concentration is in a range of twenty percent to one-hundred fifty percent greater than the second doping concentration.

6. The vertical transistor of claim 1, wherein the mesa is an active mesa of the vertical transistor.

7. The vertical transistor of claim 1, wherein:
the mesa is an inactive mesa of the vertical transistor;
a first trench of the plurality of perpendicularly intersecting trenches parallel to, and adjacent to a first side of the inactive mesa includes a contact to a shield electrode of the shielded gate structure; and
a second trench of the plurality of perpendicularly intersecting trenches parallel to, and adjacent to a second side of the inactive mesa includes a gate pass-through of the shielded gate structure, the second side being opposite the first side.

8. A vertical transistor comprising:
a semiconductor region;
a first trench disposed in the semiconductor region, the first trench being aligned along a first longitudinal axis;
a second trench disposed in the semiconductor region, the second trench being spaced from the first trench and aligned along a second longitudinal axis that is parallel to the first longitudinal axis;
a third trench disposed in the semiconductor region, the third trench being aligned along a third longitudinal axis that is perpendicular to the first longitudinal axis, the third trench intersecting the first trench and the second trench; and
a fourth trench disposed in the semiconductor region, the fourth trench being spaced from the third trench and aligned along a fourth longitudinal axis that is parallel to the third longitudinal axis, the fourth trench intersecting the first trench and the second trench,
the first trench, the second trench, the third trench and the fourth trench defining a mesa of the semiconductor region, the mesa including:
  a first end portion having a first doping concentration of a first conductivity type;
  a second end portion having the first doping concentration of the first conductivity type; and
  a central portion disposed between the first end portion and the second end portion, the central portion having a second doping concentration of the first conductivity type that is less than the first doping concentration.

9. The vertical transistor of claim 8, wherein the mesa is a first mesa, the vertical transistor further comprising:
a fifth trench disposed in the semiconductor region, the fifth trench being spaced from the fourth trench and aligned along a fifth longitudinal axis parallel that is parallel to the fourth longitudinal axis, the fifth trench intersecting the first trench and the second trench,
the first trench, the second trench, the fourth trench and the fifth trench defining a second mesa of the semiconductor region, the second mesa including:
  a first end portion having the first doping concentration of the first conductivity type;
  a second end portion having the first doping concentration of the first conductivity type; and
  a central portion disposed between the first end portion of the second mesa and the second end portion of the second mesa, the central portion of the second mesa having the second doping concentration of the first conductivity type,
  the second mesa being aligned along a seventh longitudinal axis that is co-linear with a longitudinal axis of the first mesa.

10. The vertical transistor of claim 8, wherein the mesa is a first mesa, the vertical transistor further comprising:
a fifth trench disposed in the semiconductor region, the fifth trench intersecting the fourth trench and being aligned along a fifth longitudinal axis that is perpendicular to the fourth longitudinal axis;
a sixth trench disposed in the semiconductor region, the sixth trench intersecting the fourth trench and being aligned along a sixth longitudinal axis that is perpendicular to the fourth longitudinal axis, the sixth trench being spaced from the fifth trench; and
a seventh trench disposed in the semiconductor region, the seventh trench being spaced from the fourth trench and aligned along a seventh longitudinal axis parallel to the fourth longitudinal axis, the seventh trench intersecting the fifth trench and the sixth trench,
the fourth trench, the fifth trench, the sixth trench and the seventh trench defining a second mesa of the semiconductor region, the second mesa including:
  a first end portion having the first doping concentration of the first conductivity type;
  a second end portion having the first doping concentration of the first conductivity type; and
  a central portion disposed between the first end portion of the second mesa and the second end portion of the second mesa, the central portion of the second mesa having the second doping concentration of the first conductivity type, the second mesa being aligned along a seventh longitudinal axis that is co-linear with the first longitudinal axis of the first trench, or co-linear with the second longitudinal axis of the second trench.

11. The vertical transistor of claim 8, wherein:

the first trench and the second trench have a first width; and the third trench and the fourth trench have a second width that is greater than the first width.

12. The vertical transistor of claim 8, wherein:

the first trench, the second trench, the third trench, and the fourth trench have a same width.

13. The vertical transistor of claim 8, wherein:

the first end portion and the second end portion have a first width; and the central portion has a second width that is greater than the first width.

14. The vertical transistor of claim 8, wherein:

the mesa is aligned along a fifth longitudinal axis;

the first end portion has a first length along the fifth longitudinal axis;

the second end portion has the first length along the fifth longitudinal axis; and the central portion has a second length along the fifth longitudinal axis that is greater than the first length.

15. The vertical transistor of claim 14, wherein:

the first length is less than 0.5 micro-meters ($\mu$m); and the second length is greater than 3 $\mu$m.

16. The vertical transistor of claim 8, wherein the first doping concentration is in a range of twenty percent to one-hundred fifty percent greater than the second doping concentration.

17. The vertical transistor of claim 8, further comprising a region of a second conductivity type opposite the first conductivity type disposed in an upper portion of the mesa.

18. A method for producing a vertical transistor, the method comprising:

defining a semiconductor mesa of a conductivity type by forming, in a semiconductor region of the conductivity type, a plurality of perpendicularly intersecting trenches; and performing at least one implant of the conductivity type to:

dope a first end of the semiconductor mesa with a first doping concentration; and dope a second end of the semiconductor mesa with the first doping concentration, a central portion of the semiconductor mesa disposed between the first end and the second end and having a second doping concentration that is less than the first doping concentration.

19. The method of claim 18, wherein the second doping concentration is an initial doping concentration of the semiconductor region.

20. The method of claim 18, wherein performing the at least one implant includes:

forming a mask to exclude the at least one implant from the central portion of the semiconductor mesa; and performing the at least one implant orthogonal to a surface of the semiconductor region.

21. The method of claim 20, wherein the at least one implant is performed:

after formation of a shield electrode in the plurality of perpendicularly intersecting trenches; or after formation of the shield electrode and a gate electrode in the plurality of perpendicularly intersecting trenches.

22. The method of claim 18, wherein:

the semiconductor mesa is aligned along a longitudinal axis; and performing the at least one implant includes:

performing a first implant in a first direction parallel to the longitudinal axis; and performing a second implant in a second direction parallel to the longitudinal axis, the second direction being opposite the first direction, the first implant and the second implant being performed at an angle between twenty degrees and sixty degrees relative to a line that is orthogonal to a surface of the semiconductor region.

23. The method of claim 22, further comprising:

prior to performing the at least one implant, forming a sacrificial material layer in the plurality of perpendicularly intersecting trenches; and after performing the at least one implant, removing the sacrificial material layer.

24. The method of claim 22, wherein forming the plurality of perpendicularly intersecting trenches includes:

prior to performing the at least one implant, performing a first trench etch to a first depth in the semiconductor region; and after performing the at least one implant, a second trench etch to a second depth in the semiconductor region, the second depth being greater than the first depth.

25. The method of claim 18, wherein:

the semiconductor mesa is aligned along a longitudinal axis; and performing the at least one implant includes:

performing a first implant in a first direction that is at an angle of sixty degrees relative to a line that is orthogonal to a surface of the semiconductor region and at an angle that is between ninety and one-hundred and twenty degrees relative to the longitudinal axis; and performing a second implant in a second direction that is at the angle of sixty degrees relative to the line that is orthogonal to the surface of the semiconductor region and at an angle that is between two-hundred and forty degrees and two-hundred and seventy degrees relative to the longitudinal axis.

* * * * *